(12) United States Patent
Stuber et al.

(10) Patent No.: US 9,007,061 B2
(45) Date of Patent: Apr. 14, 2015

(54) METHOD FOR MAGNETIC RESONANCE IMAGING USING INVERSION RECOVERY WITH ON-RESONANT WATER SUPPRESSION INCLUDING MRI SYSTEMS AND SOFTWARE EMBODYING SAME

(75) Inventors: Matthias Stuber, Ellicott City, MD (US); Wesley D. Gilson, Pasadena, MD (US); Dara L. Kraitchman, Oxford, MD (US)

(73) Assignee: The Johns Hopkins University, Baltimore, MD (US)

( * ) Notice: Subject to any disclaimer, the term of this patent is extended or adjusted under 35 U.S.C. 154(b) by 284 days.

(21) Appl. No.: 13/279,686

(22) Filed: Oct. 24, 2011

(65) Prior Publication Data
US 2012/0062227 A1    Mar. 15, 2012

Related U.S. Application Data

(62) Division of application No. 11/883,534, filed as application No. PCT/US2006/003832 on Feb. 3, 2006, now Pat. No. 8,054,075.

(60) Provisional application No. 60/649,250, filed on Feb. 3, 2005.

(51) Int. Cl.
  *G01V 3/00*    (2006.01)
  *G01R 33/48*   (2006.01)

(52) U.S. Cl.
  CPC ................... *G01R 33/4828* (2013.01)

(58) Field of Classification Search
  CPC ..................................................... G01R 33/282
  USPC ............................ 324/307, 306, 309, 314, 300
  See application file for complete search history.

(56) References Cited

U.S. PATENT DOCUMENTS

| | | | |
|---|---|---|---|
| 5,225,781 A | 7/1993 | Glover et al. | |
| 5,995,863 A | 11/1999 | Farace et al. | |
| 6,002,254 A * | 12/1999 | Kassai et al. | 324/306 |
| 6,121,775 A * | 9/2000 | Pearlman | 324/309 |
| 7,208,951 B2 | 4/2007 | Pruessmann et al. | |
| 7,298,143 B2 | 11/2007 | Jaermann et al. | |
| 7,495,439 B2 | 2/2009 | Wiggins | |
| 8,447,089 B2 * | 5/2013 | Liu | 382/131 |

* cited by examiner

*Primary Examiner* — Louis Arana
(74) *Attorney, Agent, or Firm* — Mintz Levin Cohn Ferris Glovsky and Popeo, P.C.; Peter F. Corless; Richard B. Emmons

(57) ABSTRACT

Featured are methods for magnetic resonance imaging of a volume, such a volume having susceptibility-generating objects or interfaces having susceptibility mismatches therein. Such a method includes selectively visualizing one of susceptibility-generating objects or interfaces having susceptibility mismatches as hyperintense signals, where such visualizing includes controlling variable imaging parameters so as to control a geometric extent of a signal enhancing effect, m more particular aspects of the present invention, such selectively visualizing includes attenuating or essentially suppressing signals from fat and/or water, namely on-resonant water protons, so as to thereby enhance a signal(s) associated with magnetic susceptibility gradient(s). Also featured are MRI systems, apparatuses and/or applications programs for execution on a computer system controlling the MRI data acquisition process embodying such methods.

4 Claims, 14 Drawing Sheets

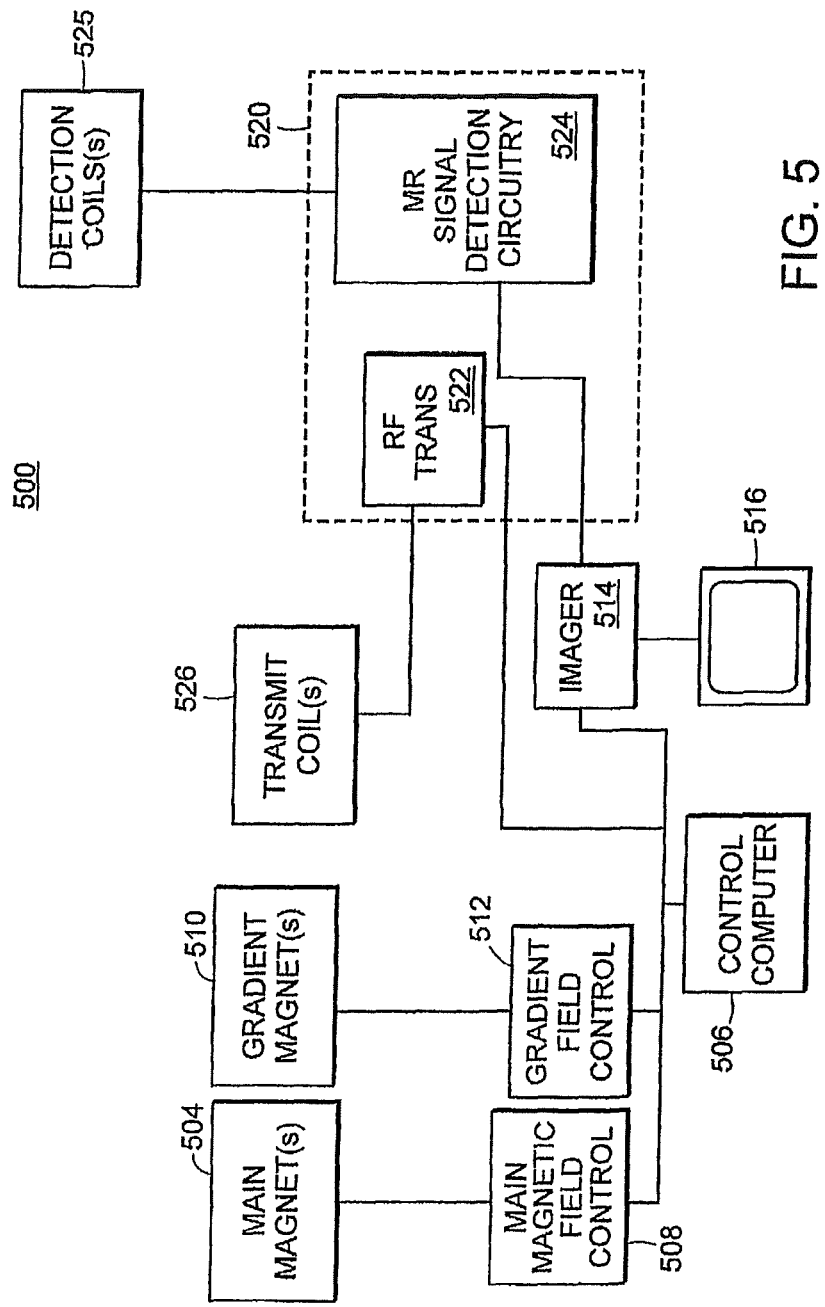

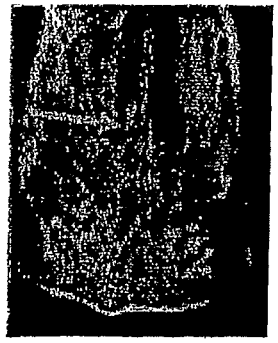 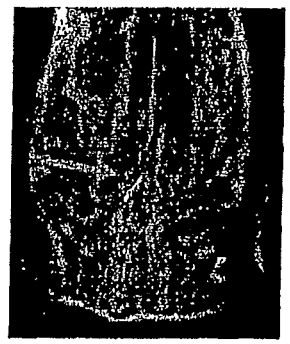 
FIG. 19A    FIG. 19B    FIG. 19C
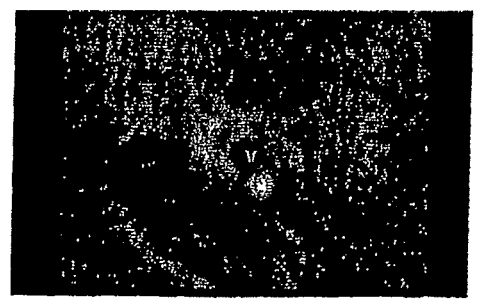
FIG. 20

METHOD FOR MAGNETIC RESONANCE IMAGING USING INVERSION RECOVERY WITH ON-RESONANT WATER SUPPRESSION INCLUDING MRI SYSTEMS AND SOFTWARE EMBODYING SAME

STATEMENT REGARDING FEDERALLY-SPONSORED RESEARCH

This invention was made with government support under 1RO1-HL073223-01 awarded by the National Institute of Health (NIH/NHLBI). The U.S. Government has certain rights in the invention.

This application is a divisional of co-pending U.S. application Ser. No. 11/883,534, filed Feb. 25, 2008 (Now Allowed); which is a National Stage Filing of PCT Application No. PCT/US06/03832, filed Feb. 3, 2006, which application claims the benefit of U.S. Provisional Application Ser. No. 60/649,250, Feb. 3, 2005, the teachings of all of which are incorporated herein by reference.

FIELD OF INVENTION

The present invention generally relates to methods, systems, apparatus and software/applications programs for magnetic resonance imaging and more particularly to methods, systems, apparatus and software/applications programs for magnetic resonance imaging with inversion recovery and suppression of fat and/or on-resonant water signal.

BACKGROUND OF THE INVENTION

Magnetic resonance imaging (MRI) is a noninvasive imaging modality capable of distinguishing a wide variety of objects based on their intrinsic composition and also is an imaging technique that is capable of providing one-, two- or three-dimensional imaging of the object. A conventional MRI system typically includes a main or primary magnet that provides the main static magnetic field $B_o$, magnetic field gradient coils and radio frequency (RF) coils, which are used for spatial encoding, exciting and detecting the nuclei for imaging. Typically, the main magnet is designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,689,563; 4,968,937 and 5,990,681, the teachings of which are incorporated herein by reference, some exemplary MRI systems.

In MRI, the uniform magnetic field $B_o$ generated by the main magnet is applied to an imaged object by convention along the Z-axis of a Cartesian coordinate system, the origin of which is within the imaged object. The uniform magnetic field $B_o$ being applied has the effect of aligning the magnetization arising from the nuclei of the atoms comprising the imaged object, along the Z-axis, such nuclei possess a nuclear magnetization due to their having an odd number of protons or neutrons. In response to RF magnetic field pulses of the proper frequency, with field direction orientated within the XY plane, the nuclei resonate at their Larmor frequencies, $\omega = \gamma B_o$ where $\gamma$ is called the gyromagnetic ratio. In a typical planar imaging sequence, the RF signal centered about the desired Larmor frequency is applied to the imaged object at the same time a magnetic field gradient $G_z$ is being applied along the Z-axis. This gradient field $G_z$ causes only the nuclei in a slice of limited thickness through the object perpendicular to the Z-axis, to satisfy the resonant condition and thus be excited into resonance.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the precessing nuclei by frequency. Thus, this gradient is often referred to as a frequency encoding or read-out gradient. The Y-axis gradient $G_y$ is incremented through a series of values and encodes the Y position into the rate of change of the phase of the precessing nuclei as a function of gradient amplitude, a process typically referred to as phase encoding.

The quality of the image produced by the MRI techniques is dependent, in part, upon the strength of the magnetic resonance (MR) signal received from the precessing nuclei. For this reason an independent RF coil is often placed in close proximity to the region of interest of the imaged object, more particularly on the surface of the imaged object, in order to improve the strength of the received signal. Such RF coils are sometimes referred to as local coils or surface coils.

There is described in U.S. Pat. No. 4,825,162 a surface coil(s) for use in MRI/NMRI imaging and methods related thereto. In the preferred embodiment of that invention, each surface coil is connected to the input of an associated one of a like plurality of low-input-impedance preamplifiers, which minimizes the interaction between any surface coil and any other surface coils not immediately adjacent thereto. These surface coils can have square, circular and the like geometries. This yields an array of a plurality of closely spaced surface coils, each positioned so as to have substantially no interaction with all adjacent surface coils. A different MR response signal is received at each different one of the surface coils from an associated portion of the sample enclosed within the imaging volume defined by the array. Each different MR response signal is used to construct a different one of plurality of different images from each surface coil. These images are then combined, on a point-by-point basis to produce a single composite MR image of a total sample portion comprised of the MR response signals from the entire array of surface coils.

Common MRI strategies use the relative density of water protons in a sample and the relaxation properties of energy exchange between the local spins with the lattice and with each other to achieve contrast between tissues. The spin-lattice interaction is described by the $T_1$ relaxation time, and the spin-spin interaction is described by the $T_2$ relaxation time. Furthermore, static field inhomogeneities directly affect $T_2$ relaxivity as the local field variations introduce rapid intra-voxel dephasing. These inhomogeneities can arise from a variety of sources, but significant mismatches in tissue magnetic susceptibility coefficients between adjacent tissues or objects are an important source. As a result, transverse signal decay occurs much faster and the modified relaxation time is referred to as $T_2^*$. Thus, MRI pulse sequences are conventionally designed to extract tissue contrast by exploiting intrinsic differences in the proton density, $T_1$, $T_2$, and $T_2^*$.

In general, MRI relies heavily on a homogeneous static field for accurate imaging. Additionally, the object or objects being imaged commonly exhibit a diamagnetic behavior, which means that their magnetic susceptibility values ($\chi$) are both small and negative. In contrast, non-diamagnetic objects may have $\chi$ values that are small and positive (paramagnetic)

or large and positive (ferromagnetic). Objects that create magnetic field susceptibility typically lead to signal voids in MRI that extend well beyond the area encompassed by these objects (i.e., "bloom artifact"). Moreover, there are many potential sources of signal voids (e.g., absence of signal-generating substance, motion artifacts, magnetic field inhomogeneity, etc.) that have similar hypointense signal intensity in images.

The creation of the signal void is related to the magnetic susceptibility gradients (MSGs) created by the non-diamagnetic object. In turn, MSGs are dependent on many factors, including the magnetic susceptibility value of the non-diamagnetic objects, the environment in which the non-diamagnetic object is placed, the type of pulse sequence used, and the individual imaging parameters associated with the pulse sequence. Therefore, the specificity for localization of susceptibility-generating objects is suboptimal.

Since non-diamagnetic objects affect $T_1$ and $T_2$ relaxation properties, imaging strategies have been adopted either to minimize or maximize the $T_2^*$ effects of these agents depending on whether the goal is to minimize or maximize the sensitivity to the object, respectively. One method is to acquire $T_1$ and/or $T_2$ maps, which is a time-intensive process, lacks sensitivity, and is difficult to acquire on moving structures.

Other common methods for detecting susceptibility-inducing objects are $T_2^*$-weighted images using spin echo (SE) [Hahn, E. L. Spin Echoes. *Phys Rev* 1950; 80 (4): 580-594], fast spin echo (FSE) [Henning, J., Nauerth, A. and H. Friedburg. RARE imaging: a fast imaging method for clinical MR. *Magn Reson Med* 1986; 3: 823-833], or gradient echo (GRE) [van der Meulen, P., Groen, J. P. and J. J. Cuppen. Very fast MR imaging by field echoes and small angle excitation. *Magn Reson Imaging* 1985; 3 (3): 297-299] imaging. $T_2^*$-weighted imaging is quite sensitive to MSGs but often creates large signal voids that extend far beyond the source object. Thus, the relationship between the non-diamagnetic object volume and the volume of the hypointensity may not be linear. Furthermore, the negative contrast associated with non-diamagnetic objects can be difficult to discriminate from other potential sources of signal voids (i.e., the absence of tissue, motion artifacts, calcifications, hemorrhage, etc.).

Techniques have been recently proposed to create positive contrast from the susceptibility artifacts created by such non-diamagnetic objects as superparamagnetic iron oxide nanoparticles [Cunningham, C. H., Arai, T., Yang. P., M., McConnell, M. V., Pauly, S. M., and S. M. Conolly. (2004). Positive contrast magnetic imaging of cells labeled with magnetic nanoparticles. *Magn Reson Med* 2005; 53 (5):999-1005 (2005); Coristine, A. S., Foster, P. J., Deoni, S. C., Heyn, C. and B. K. Rutt (2004). Positive contrast labeling of SPIO loaded cells in cell samples and spinal cord injury. Proc Intl Soc Magn Reson Med 11: 163; and Mani, V., Briley-Saebo, K. C., Itskovich, V. V., Samber, D. D. and Z. A. Fayad. Gradient echo acquisition for superparamagnetic particles with positive contrast (GRASP): sequence characterization in membrane and glass superparamagnetic iron oxide phantoms at 1.5 T and 3 T. *Magn Reson Med* 2006; 55 (1):126-135.] and paramagnetic ring-tipped catheters [Seppenwoolde, J. H., Viergever, M. A. and Bakker, C. J. Passive tracking exploiting local signal conservation: the white marker phenomenon. *Magn Reson Med* 2003; 50 (4): 784-790]. The technique proposed by Cunningham et al uses spectrally-selective radio frequency pulses to image a spectral band assumed to be associated with the MSGs. The techniques described in Coristine et al., Seppenwoolde et al., and Mani et al. use a "white marker" method where signal enhancement is created using gradient imbalances such that only a set of spectral frequencies associated with the MSGs is refocused. Both of these methods produce a positive signal, rather than signal voids, however, this is achieved at the cost of a large signal loss. Furthermore, the technique by Cunningham et al. is sensitive to the tuning of the passband and may further attenuate signal from the MSGs. The techniques used by Seppenwoolde et al., Mani et al., and Coristine et al. also require careful consideration of imaging parameters.

Also, interventional MRI is playing an increasingly important role for guiding endovascular procedures. MR-compatible devices for these procedures are often designed to be non-magnetic or to be made from magnetic resonance (MR) invisible using materials, such as nitinol. Thus, localization of the device becomes difficult. To make MR-compatible devices MR-visible, either passive markers are incorporated [Bakker, C. J., Hoogeveen, R. M., Weber, J., van Vaals, J. J., Viergever, M. A. and W. P. Mali. Visualization of dedicated catheters using fast scanning techniques with potential for MR-guided vascular interventions. *Magn Reson Med* 1996; 36 (6): 816-820; Bakker, C. J., Hoogeveen, R. M., Hurtak, W. F., van Vaals, J. J., Viergever, M. A. and W. P. Mali. MR-guided endovascular interventions: susceptibility-based catheter and near-real-time imaging technique. *Radiology* 1997; 202 (1): 273-276; Bakker, C. J., Bos, C. and H. J. Weinmann. Passive tracking of catheters and guidewires by contrast-enhanced fluoroscopy. *Magn Reson Med* 2001; 45 (1): 17-23; Wacker, F. K., Reither, K., Branding, G., Wendt, M. and K. J. Wolf. Magnetic resonance-guided vascular catheterization: feasibility using a passive tracking technique at 0.2 Tesla in a pig model. *J Magn Reson Imaging* 1999; 10 (5): 841-844], or active coil tracking systems are incorporated [Atalar, E., Bottomley, P. A., Ocali, O., Correia, L. C., Kelemen, M. D., Lima, J. A. and E. A. Zerhouni. High resolution intravascular MRI and MRS by using a catheter receiver coil. *Magn Reson Med* 1996; 36 (4): 596-605; Dumoulin, C. L., Souza, S. P. and R. D. Darrow. Real-time monitoring of invasive devices using magnetic resonance. *Magn Reson Med* 1993; 29 (3): 411-415; Erhart, P., Ladd, M. E., Steiner, P., Heske, N., Dumoulin, C. L. and J. F. Debatin. Tissue-independent MR tracking of invasive devices with an internal signal source. *Magn Reson Med* 1998; 39 (2): 279-284; Ladd, M. E., Zimmermann, G. G., McKinnon, G. C., von Schulthess, G. K., Dumoulin, C. L., Darrow, R. D., Hofmann, E. and J. F. Debatin. Visualization of vascular guidewires using MR tracking. *J Magn Reson Imaging* 1998; 8 (1): 251-253; Wendt, M., Busch, M., Wetzler, R., Zhang, Q., Melzer, A., Wacker, F., Duerk, J. L. and J. S. Lewin. Shifted rotated keyhole imaging and active tip-tracking for interventional procedure guidance. *J Magn Reson Imaging* 1998; 8 (1): 258-261] are incorporated. Such incorporation with the device, however, has the negative impact of increasing the device diameter and device complexity.

In addition, chemical analysis of iron from liver needle biopsy specimens is currently the most accepted method of diagnosis of iron storage diseases such as hemochromatosis and thalassemia. However, hepatic iron concentration (HIC) measurements by needle biopsy have several problems including: sampling errors owing to the large variation in HIC from site to site within the liver and the uncomfortable nature of the procedure for patients which limits testing frequency. MRI methods have been used to non-invasively assess iron overload in the liver and heart [Anderson, L. J., Holden, S., Davis, B., Prescott, E. Charrier, C. C., Bunce, N. H., Firmin, D. N., Wonke, B., Porter, J., Walker, J. M. and D. J. Pennell. Cardiovascular T2-star (T2*) magnetic resonance for the early diagnosis of myocardial iron overload. *Eur Heart J*

2001; 22: 2171-2179; Clark, P. R. and T. G. St. Pierre. Quantitative $1/T_2$ mapping of hepatic iron overload: a single spin echo imaging methodology. *Magn Reson Imaging* 2000; 18: 431-438; Jensen, P. D., Jensen, F. T., Christensen, T., Eiskjaer, H., Baandrup, U. and J. L. Nielsen. Evaluation of myocardial iron by magnetic resonance imaging during iron chelation therapy with deferrioxamine: indication of close relation between myocardial iron content and chelatable iron pool. *Blood* 2003; 101: 4632-4639; Mavrogeni, S. I. Gotsis, E. D., Markussis, V., Tsekos, N., Politis, C., Vretou, E. and D. Kermastinos. T2 relaxation time study of iron overload in β-thalassemia. *MAGMA* 1998; 6 (1): 7-12; Westwood, M., Anderson, L. J., Firmin, D. J., Gatehouse, P. D., Charrier, C. C. Wonke, B. and D. J. Pennell. A single breath-hold multi-echo T2* cardiovascular magnetic resonance technique for diagnosis of myocardial iron overload. *J Magn Reson Imaging* 2003; 18: 33-39], thereby overcoming sampling errors and allowing more frequent testing. There is still a need, however, for non-invasive measurement techniques that are more sensitive for iron measurement.

A non-invasive MRI technique commonly referred to as BOLD MRI [Ogawa, S., Lee, T. M., Kay, A. R. and D. W. Tank. Brain magnetic resonance imaging with contrast dependent on blood oxygenation. *Proc Natl Acad Sci USA* 1990; 87 (24): 9868-9872] has been used to assess blood oxygenation, where differences in blood oxygenation are used to modulate signal intensity. Briefly, hemoglobin is the iron-containing respiratory protein of red blood cells that transports oxygen as oxyhemoglobin from the lungs to the tissues. Following delivery of oxygen to the tissues, the oxyhemoglobin becomes deoxyhemoglobin with a resulting change in the magnetic properties of the blood. Deoxyhemoglobin is paramagnetic and thus produces intravascular bulk magnetic field gradients in and around the surrounding tissue. BOLD MRI uses a subtraction technique with $T_2$*-weighted imaging to study blood flow and oxygen utilization. Because of the small signal change generated by the BOLD effect, however, BOLD MRI is typically performed on high-field scanners (3 T or greater). Thus, there continues to be a need to assess blood oxygenation using MRI scanners at lower field strengths (e.g., 1.5 T).

The references discussed herein are provided solely for their disclosure prior to the filing date of the present application. Nothing herein is to be construed as an admission that the inventors are not entitled to antedate such disclosure by virtue of prior invention.

It thus would be desirable to provide a methodology for acquisition of MRI image data where susceptibility-generating objects, including preferably other sources of static field inhomogeneities, as hyperintense signals with the geometric extent of the signal-enhancing effect being controlled by imaging parameters that can be varied as well as MRI systems, MRI apparatuses and software applications programs embodying such methods. It would be particularly desirable to provide such systems, methods and applications programs that would embody a positive contrast method that uses selective suppression methods to attenuate some signals and enhancing signals associated with magnetic susceptibility gradients. It would be particularly desirable to provide such systems, methods and applications programs that would attenuate signals from fat and from water, more specifically on-resonant water. It would be particularly desirable to provide such systems, methods and applications programs that would attenuate signals such as those for fat and/or on-resonant water protons and enhance signals associated with magnetic susceptibility gradients, thereby improving contrast-to-noise ratio and specificity of MSGs in comparison to prior art methods, systems and/or applications programs.

SUMMARY OF THE INVENTION

The present invention features methods for magnetic resonance imaging of a volume, such a volume having therein susceptibility-generating objects or interfaces having susceptibility mismatches. Such a method includes selectively visualizing the susceptibility-generating objects or interfaces having susceptibility mismatches as hyperintense signals, where such visualizing includes controlling variable imaging parameters so as to control a geometric extent of a signal enhancing effect. Also featured are MRI systems, apparatuses and/or applications programs for execution on a computer system controlling the MRI data acquisition process embodying such methods. In more particular aspects of the present invention, such selectively visualizing includes attenuating or essentially suppressing signals from fat and water, namely on-resonant water protons, so as to thereby enhance a signal (s) associated with magnetic susceptibility gradient(s). Such methods are particularly advantageous as they increase the contrast-to-noise ratio and specificity for magnetic susceptibility gradient(s) as compared to that achievable with known techniques.

In more particular aspects, there is featured a method for magnetic resonance imaging including selective attenuating or substantial suppressing a fat signal(s); attenuating or substantially suppressing a signal(s) from on-resonance water protons; and acquiring image data after such attenuating or substantially suppressing. In more particular embodiments, the selective attenuating or substantial suppressing of the fat signal is established based on one of $T_1$ nulling or spectral pre-saturation. In yet more particular embodiments, the selective attenuating or substantial suppressing of the fat signal includes applying radio frequency pulses to the volume being imaged to substantially suppress the fat signal based on its $T_1$ relaxivity. In yet more particular embodiments, such applying radio frequency pulses includes applying a series of radio frequency pulses to the volume that are temporally separated to substantially suppress the fat signal based on its $T_1$ relaxivity.

In yet more particular embodiments, such applying radio frequency pulses includes a applying a first radio frequency pulse non-selectively to produce a 180° inversion of protons excited in the imaging volume and further applying a crusher gradient to dephase transverse magnetization that can arise from the excitation of protons from such applying a first radio frequency pulse. Also, such methods further include applying a second radio frequency pulse non-selectively to the imaging volume to produce a 180° inversion of the previously inverted and partially recovered magnetization and further applying a crusher gradient to dephase transverse magnetization that can arise from the excitation of protons from such applying a second radio frequency pulse.

In alternative particular embodiments, the selective attenuating or substantial suppressing of the fat signal includes applying a spectral presaturation radio frequency pulse with a center frequency at or near a predetermined frequency so as to thereby excite protons within the imaging volume that resonate at frequencies within the bandwidth of the radio frequency pulse. Such methods further include applying a crusher gradient to dephase transverse magnetization created by excitation of fat protons following such applying a spectral presaturation radio frequency pulse. In further embodiments, such applying a spectral presaturation radio frequency pulse includes applying a spectral presaturation radio frequency pulse with a center frequency at or near a resonance frequency of fat protons.

Also in more particular embodiments of such methods, such attenuating or substantially suppressing signal from on-resonance water protons includes spectral pre-saturating so as to excite and suppress signals from the on-resonance water protons. In yet more particular embodiments such attenuating or substantially suppressing signal from on-resonance water protons includes applying a spectral pre-saturation radio frequency pulse having a predetermined center frequency so as to excite protons within the imaging volume that resonate at frequencies within the bandwidth of the radio frequency pulse. In more specific embodiments, such applying a spectral pre-saturation radio frequency pulse includes applying a spectral pre-saturation radio frequency pulse with a center frequency typically matching the resonance frequency of water protons. In further embodiments, such attenuating or substantially suppressing signal from on-resonance water protons includes applying a crusher gradient to dephase the transverse magnetization created by excitation of on-resonance protons by such applying a spectral pre-saturation radio frequency pulse.

In alternative particular embodiments of such methods, such attenuating or essentially suppressing signals from fat and water includes applying a spectral presaturation radio frequency pulse having a predetermined frequency and predetermined bandwidth sufficient to excite both on-resonance water and fat protons. In yet further embodiments, such applying a spectral presaturation radio frequency pulse having a predetermined frequency and predetermined bandwidth includes applying a spectral presaturation radio frequency pulse having a predetermined frequency and predetermined bandwidth that does not significantly excite off-resonance protons precessing at frequencies greater than the resonant frequency of water. Also, such applying spectral presaturation radio frequency pulse having a predetermined frequency and predetermined bandwidth includes applying a spectral presaturation radio frequency pulse that is characterized by having a region with a first region having a first predetermined bandwidth that is set so as to excite fat protons and a second region having predetermined bandwidth that is set so as to excite on-resonance water protons and where a third region between the first and second regions is set so that any signal in this region does not significantly excite off-resonance protons precessing at frequencies greater than the resonant frequency of water.

In yet more particular embodiments, such attenuating or essentially suppressing signals from fat and water includes applying a crusher gradient to dephase the transverse magnetization created by excitation of protons after such applying a spectral presaturation radio frequency pulse having a predetermined frequency and predetermined bandwidth.

In yet further embodiments, such acquiring image data includes acquiring image data using any of 1D, 2D or 3D magnetic resonance image acquisition technique.

In yet further embodiments, such methods further include locating an interventional device containing non-diamagnetic materials within the image volume, such interventional devices including guide catheters, stents, and coils.

In yet further embodiments, the volume being imaged includes one or more of (a) objects containing superparamagnetic and ultra-small superparamagnetic iron oxide particles (e.g., cells, capsules), (b) iron accumulation in the liver, spleen, or lymphatic system, (c) blood vessels following intravascular injection of contrast agents that induce susceptibility gradients; (d) deoxyhemoglobin/oxyhemoglobin differences in function MRI studies or (e) hemorrhage or hematomas. Such contrast agents introduced into the blood vessels including iron oxides or gadolinium chelates. In yet further embodiments, the volume being imaged includes an air/lung interface having a magnetic susceptibility mismatch, such as when performing lung tissue pathology.

In further aspects of the present invention, such methods are adapted for use in MRI navigating techniques. Also, such methods are adaptable for use in the design of MRI navigator techniques for interactive motion detection and/or respiratory gating.

In further aspects of the present invention, the methods of the present invention also include performing MRI data acquisition switchably between using the MRI methods of the present invention and using a conventional MRI technique. Preferably such switchable use is done so as to allow the MRI method of the present invention to be in effect switched on and off so as to allow the clinician to visualize normal anatomy with the base magnetic resonance image acquisition technique as well as visualize the anatomy using the methods of the present invention.

In further aspects of the present invention, such methods of the present invention are adapted so that the MRI imaging process is useable to assess quantitatively non-diamagnetic material volume or concentration.

As indicated herein the present invention also features an application or software program for execution on a computer, computing device or microprocessor as is known to those skilled in the art. Such software or applications program includes code segments, instruction and criteria to suppress fat and on-resonant water signals, to acquire the image data after such suppressing, and to process the image data. Also featured is a computer readable medium on which is stored such an applications program or software.

As indicated above, the present invention also features an MRI system, or apparatus controlling acquisition of MRI image data that embody the herein described methodology of the present invention. Also, such systems and apparatuses further include the applications program of the present invention for execution on the computing device of such systems and/or apparatus.

Other aspects and embodiments of the invention are discussed below.

DEFINITIONS

The instant invention is most clearly understood with reference to the following definitions:

A computer readable medium shall be understood to mean any article of manufacture that contains data that can be read by a computer or a carrier wave signal carrying data that can be read by a computer. Such computer readable media includes but is not limited to magnetic media, such as a floppy disk, a flexible disk, a hard disk, reel-to-reel tape, cartridge tape, cassette tape or cards; optical media such as CD-ROM and writeable compact disc; magneto-optical media in disc, tape or card form; paper media, such as punched cards and paper tape; or on carrier wave signal received through a network, wireless network or modem, including radio-frequency signals and infrared signals.

The term or acronym FSE shall be understood to mean a fast spin echo MRI technique or methodology.

The term or acronym GRE shall be understood to mean a gradient echo MRI technique or methodology.

The term or acronym MSGs shall be understood to mean magnetic susceptibility gradients.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein:

FIG. 4A), illustrating a frequency spectrum when the fat signal is suppressed (FIG. 4B); illustrating a frequency spectrum of FIG. 4B and showing the bandwidth $BW_{H2O}$ for a spectrally-selective saturation RF pulse (FIG. 4C) and illustrating a frequency spectrum when the on-resonant water signal is suppressed, leaving only signal from the magnetic susceptibility gradients (FIG. 4D).

FIG. 5 is a schematic view of an exemplary magnetic resonance imaging (MRI) system.

FIGS. 19A-C are illustrations of real-time GRASE images acquired using the signal enhancing techniques of the present invention overlayed on MR angiograph MIPS. Arrows indicate the location of the stainless steel stent as the catheter is passed through the aorta (FIG. 19A), into the right iliac artery (FIG. 19B) and after deployment in the iliac artery (FIG. 19C).

FIG. 20 is an illustration of a high resolution cross-section image acquired using the signal enhancing methods of the present invention of a stainless steel stent deployed in a canine external iliac artery. Signal enhancement is present around the vessel (v) due to the presence of the stent.

DESCRIPTION OF THE PREFERRED EMBODIMENT

In broadest aspects, there are featured methods for magnetic resonance imaging of a volume to be imaged, such a volume having susceptibility-generating objects or interfaces having susceptibility mismatches. Such a method includes selectively visualizing one of susceptibility-generating objects or interfaces having susceptibility mismatches as hyperintense signals. Also featured are MRI systems, apparatuses and/or applications programs for execution on a computer system controlling the MRI data acquisition process. As described further herein, such selectively visualizing further includes attenuating or essentially suppressing signals from fat and water, namely on-resonant water protons, so as to thereby enhance a signal(s) associated with magnetic susceptibility gradient(s). Such methods are particularly advantageous as they increase contrast-to-noise ratio and specificity for magnetic susceptibility gradient(s) as compared to that achievable with known techniques.

Figure 1:
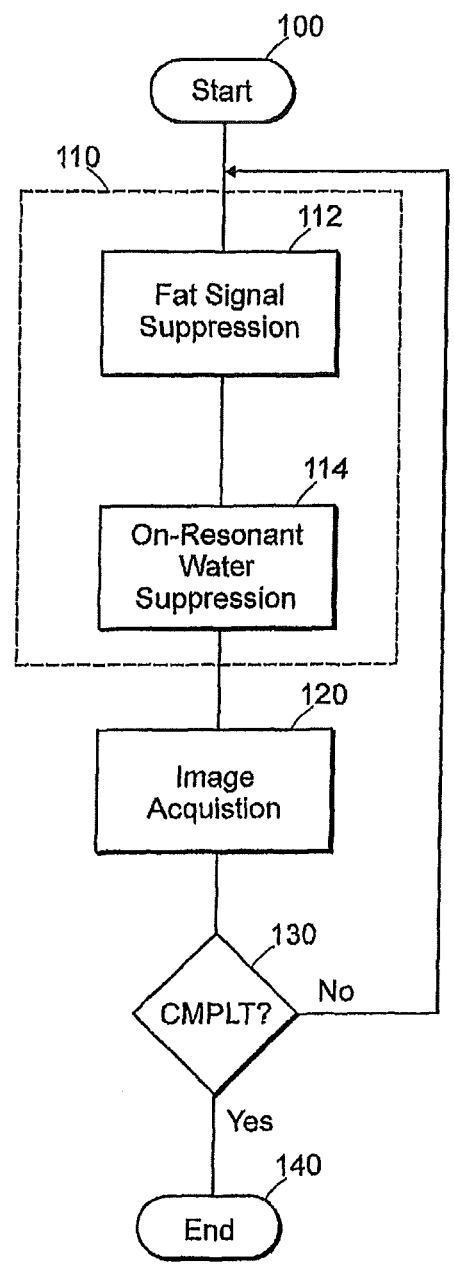
FIG. 1 is a high level flow diagram of the methodology of the present invention.

Now referring now to the various figures of the drawing wherein like reference characters refer to like parts, there is shown in FIG. 1 a high level flow diagram of an MRI imaging method according to the present invention. It is within the scope and skill of those knowledgably in the art to adapt the below described methodology so as to be used with any of a number of MRI data acquisition techniques for acquiring data so as to yield one-dimensional (1-D), two dimensional (2-D) or three dimensional (3-D) images of the volume or area being imaged.

The image acquisition process and the methodologies of the present invention are started, Step 100 at the time a patient or object is to be imaged using the MRI technique as herein described to acquire the image data for processing in accordance with the present invention. Such starting includes preparing the MRI devices and apparatus that are to be used to carryout the imaging, preparing the object or patient for the MRI process and undertaking any initial imaging for localizing or positioning the object/patient with respect to the field of view of the MRI scanning apparatus. Such MRI devices and apparatus are well known in the art as herein discussed.

It should be recognized that it is contemplated that the MRI methods of the present invention are to be used in connection with the performance of clinical, diagnostic, interventional, and/or surgical procedures. Thus, it is contemplated and within the skill of those in the art to adapt the MRI methods of the present invention when needed to accommodate such the performance of clinical, diagnostic, interventional, and/or surgical procedures.

For example, the other procedure being performed is likely to dictate when and where imaging is to be performed and so the methods of the present invention would be adapted so as to be performed when and where the other procedure would require. It should be recognized that such adaptation is within the skill of those knowledgeable in the art using the teachings herein, including the examples provided below.

As indicated above, before acquiring the image data or performing any of the other described steps for preparing the volume or region or area of interest to be imaged, the patient or object is arranged or positioned so that the region or area of interest will be located or positioned in a desired area (e.g., center) of the image, Step 100. It should be recognized that while it is desirous to position the cross-section or volume to be imaged so it would be generally located or positioned in the center of the image, it is within those skilled in the art to adapt the below described procedure so that it can process an image where the cross-section or volume to be imaged is not be located or positioned in the center in the image. Typically, and as described herein, one images the object or patient using conventional MRI techniques before acquiring the image data to be processed so as to position the object/person for data acquisition.

After the patient or object is positioned, the clinician proceeds with the imaging process, and more particularly, takes the actions to selectively visualize the region or area of interest that includes one or more susceptibility-generating objects or interfaces having susceptibility mismatches, Step 100. Such selectively visualizing includes selectively visualizing the susceptibility-generating objects or interfaces having susceptibility mismatches as hyperintense signals and to enhance a signal(s) associated with magnetic susceptibility gradient(s), Step 110. More particularly, such selectively visualizing includes performing such actions as controlling variable imaging parameters so as to thereby control a geometric extent of a signal enhancing effect.

In more particular embodiments and described further herein, such selectively visualizing more particularly includes performing one or both of fat signal suppression (Step 112) and on-resonant water signal suppression (Step 114). Both are illustrated in FIG. 1 for convenience as to describing the present invention; however, it is possible that region of interest could be constituted such that there may not be a signal or one of any significance corresponding to fat or on-resonant water from the region of interest. For example, if the region or area of interest does not include material that would provide a fat signal or provide a fat signal of significance, but includes material that would provide a signal corresponding to on-resonant water, then the method of the present invention could avoid taking the actions to suppress the fat signal (i.e., skip Step 112) and just perform the actions necessary to suppress the signal(s) for on-resonant water/water protons (Step 114) to enhance the signal(s) associated with magnetic susceptibility gradient(s).

Figure 2:
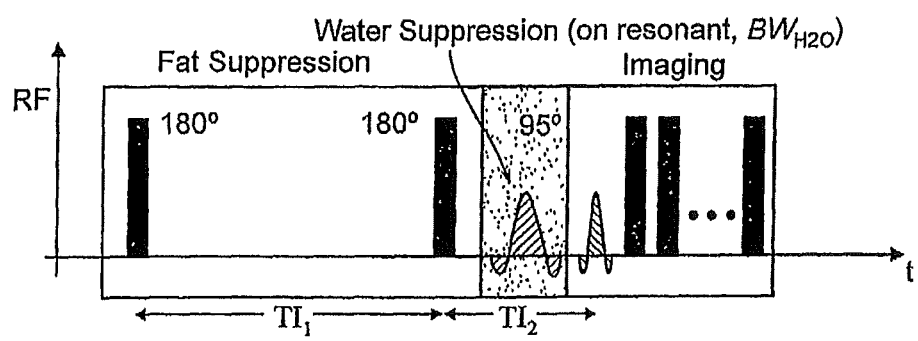
FIG. 2 is a timing diagram for an exemplary pulse sequence according to the methodology of the present invention.
Figure 3A:
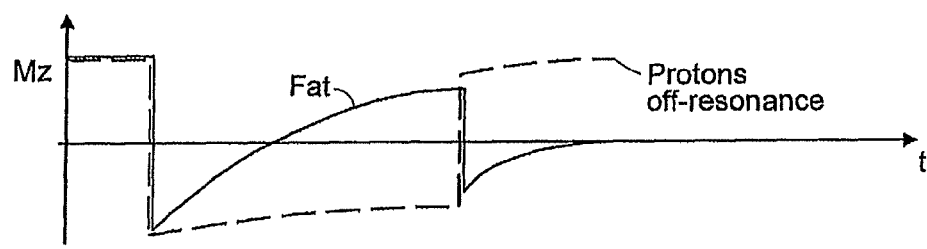
FIG. 3A is a plot of longitudinal magnetization Mz of fat (solid line) and off-resonant protons (dashed line) as a function of time at the beginning of the imaging interval using the double inversion recovery method for fat suppression with spectrally-selected on-resonant water proton suppression.
Figure 3B:
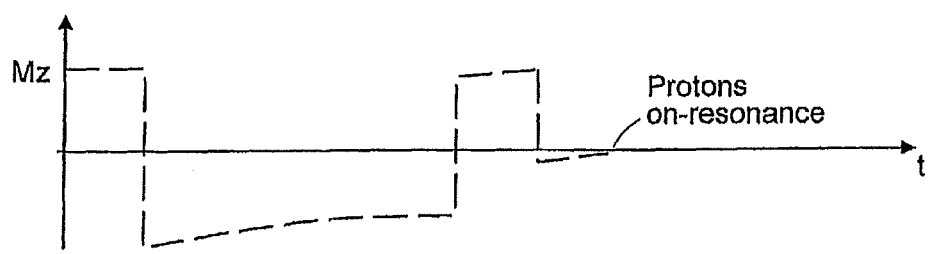
FIG. 3B is a plot longitudinal magnetization Mz of on-resonant protons (dashed line) as a function of time showing use of the double inversion recovery method for fat suppression with a spectrally-selective saturation pulse for suppression of on-resonant protons.

The following describes in more detail the actions taken to suppress the fat signal or the signal attributable to on-resonant water protons, which discussion also makes reference to FIG. 2 which is a timing diagram showing the different time intervals as well as signal pulses (e.g., pulse sequences), FIGS. 3A,B and FIGS. 4A-D. As to FIGS. 3A,B these figures are graphical plots of longitudinal magnetization (Mz) as a function of time, where FIG. 3A is a plot of the longitudinal magnetization of fat (solid line) and off-resonant protons (dashed line) that illustrates suppression of fat at the beginning of the imaging interval using the double inversion recovery method and FIG. 3B is a plot of the longitudinal magnetization of on-resonant protons illustrating the use of the spectrally-selective saturation pulse for suppression of the on-resonant protons.

As shown in FIG. 2, during a first interval 10 the fat signal is suppressed using inversion recovery techniques. In an exemplary illustrative embodiment, a pair of nonselective 180° radio frequency (RF) pulses is applied to null the longitudinal magnetization of fat as a function of its spin-lattice relaxation time constant, $T_1$. The first 180° RF pulse 12a excites the protons in the imaging volume, inverting their bulk magnetization to align along the negative longitudinal axis (FIG. 3B). From this excited state, the protons decay according to their spin-lattice relaxation time constant, $T_1$.

A crusher gradient or a dephasing gradient is applied after the first inversion pulse or the first RF pulse 12a to eliminate unwanted transverse magnetization. In specific embodiments, the crusher gradient is applied immediately after the first RF pulse 12a. For simplicity, the crusher gradients or dephasing gradients are not shown in FIG. 2; however, their effect is seen from FIGS. 3 and 4.

The crusher gradient that is applied is sufficiently large so as to dephase the transverse magnetization that may have arisen following excitation of the protons by the first RF pulse 12a. These crusher gradients can be applied in any direction but are typically applied in the direction of slice-selection. Crusher gradients or dephasing gradients and the application thereof is known to those skilled in the art and thus are not described in detail further herein.

A second 180° RF pulse 12b is applied a selected inversion delay time ($TI_1$) after the first RF pulse 12a. As with the first RF pulse 12a, a crusher gradient or a dephasing gradient is applied after the second inversion of RF pulse 12b to eliminate unwanted or undesirable transverse magnetization. A discussion regarding the optimal duration of $TI_1$ is described herein.

A solution to the Bloch equations for the invention can be used to determine the optimal duration of $TI_1$ to suppress the fat signal for the timing diagram in FIG. 2. Given that the nonselective inversion RF pulses 12a,b are 180 degrees in magnitude and the repetition time TR is long (e.g., greater than 3 times the $T_1$ value of the fat), the longitudinal magnetization $M_z$ at the beginning of the image acquisition interval for fat and off-resonant protons is:

$$M_z(t) = \left[(M(0) + M_0)e^{-\frac{TI_1}{T_1}} - 2M_0\right]e^{-\frac{TI_2}{T_1}} + M_0 \quad [\text{Eq. 1}]$$

where M(0) is the value of $M_z$ prior to the application of the first 180° RF pulse, $M_0$ is the thermal equilibrium value of the longitudinal magnetization, and $TI_2$ is the inversion delay duration that occurs between the second 180° RF pulse and start of image acquisition.

Solving Equation 1 for the steady-state longitudinal magnetization prior to application of the pre-pulse:

$$M(0) = M_0 \frac{1 - e^{-TR/T_1} - 2e^{-(TR-TI_1)/T_1}}{1 - e^{-TR/T_1}} \quad [\text{Eq. 2}]$$

With a priori knowledge of $TI_2$, based on the durations of the second nonselective 180° RF pulse, the spectrally-selective RF pulse, and the associated crusher gradients, the inversion time $TI_1$ to null fat can be computed as:

$$TI_1 = -T_1 \ln\left[\frac{2M_0 - \frac{M_0}{e^{-TI_2/T_1}}}{2M_0}\right] \quad [\text{Eq. 3}]$$

As indicated above, according to the method of the present invention, the step of such selectively visualizing 110 can be limited to suppressing the fat signal 112. In such a case, the process would proceed to acquisition of the image 120 described further herein; however, if this is not the case then the process continues with signal suppression of on-resonant water protons, Step 114. Correspondingly, if the step of such selectively visualizing 110 did not include suppression of the fat signal then Step 112 would be skipped and the process would proceed to suppressing the on-resonant water signal Step 114 following Step 100.

It should be recognized that when the fat and/or water signals are to be suppressed it is dependent upon the makeup of the region or object being imaged as well as the significance of the water and/or fat makeup of the region or object to be imaged. For example, when imaging a mammal it is unlikely that one would perform the imaging technique without suppressing on-resonant water protons given that the high water content in the tissue of mammals.

Referring now back to FIGS. 2-3, during a second interval 20 a signal(s) for on-resonant water/water protons is suppressed using spectral presaturation techniques. In more particular embodiments, a spectrally-selective RF pulse 22 is applied with predetermined bandwidth, $BW_{H2O}$ (see FIG. 4C), and a predetermined center frequency $\omega_0$. The predetermined center frequency is adjustable and typically set to be about or near the resonance frequency of water protons. In this way, those protons precessing at frequencies within the bandwidth of the RF pulse 22 are exclusively excited. A crusher gradient is then used to dephase the excited on-resonant water protons. Consequently, the off-resonant water protons (i.e., those protons affected by the diamagnetic material) remain unaffected. Thus, the resultant signal is then attributed to off-resonance frequencies due to magnetic susceptibility gradients.

Figure 4A:
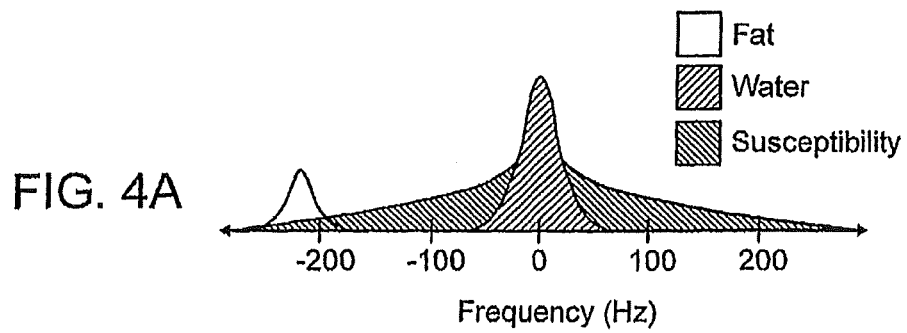
FIGS. 4A-D are various figures illustrating a frequency spectrum in the presence of fat, water protons, and a non-diamagnetic susceptibility inducing substance.

In alternative embodiments, the fat signal is suppressed (Step 112) using spectral presaturation techniques. According to one alternative embodiment, the fat signal is suppressed using one a spectrally-selective RF pulse having a predetermined bandwidth and a predetermined center frequency. The predetermined center frequency is adjustable and typically set to be about or near match the corresponding resonance frequency for fat (FIG. 4A). In this way, those protons precessing at frequencies within the bandwidth of the RF pulse 22 are exclusively excited. A crusher gradient is then used to dephase the excited on-resonant protons. Thereafter, another spectrally-selective RF pulse 22 and corresponding crusher gradient would be applied as described above to suppress the on-resonant water protons. Thus, according to this embodiment, two spectrally selective presaturation radio frequency pulses are applied consecutively at, about or near on-resonance frequencies corresponding to water and fat with appropriately determined flip angles and timings to suppress the respective signals.

In another alternative embodiment, a single spectrally selective presaturation radio frequency pulse is applied, the pulse having a sufficiently broad bandwidth spanning both the on-resonance frequencies of water and fat while preserving frequencies outside these frequencies. Thereafter, a crusher gradient is then used to dephase the excited on-resonant protons.

In yet another alternative embodiment, a single spectrally selective presaturation radio frequency pulse is applied. This single pulse is designed in such a way that it simultaneously excites two bands in the frequency spectrum. In this embodiment, the frequency spectrum is characterized by having a first region, second, third and fourth regions. The first region would have a first predetermined bandwidth and center frequency that is set so as to excite fat protons and the second region would have a predetermined bandwidth and center frequency that is set so as to excite on-resonance water protons. The off-resonant protons in the third region, which is between the first and second regions, are not significantly excited. Similarly, in the fourth region which includes off-resonant frequencies on the other side (other side than fat) of the frequency spectrum, the protons are not significantly excited. In more particular embodiments, the presaturation RF pulse applied in the third region could be characterized as having an amplitude that is one of about zero, less than 1/100 of the amplitude of the RF pulse in one of the two bands to suppress the fat or on-resonant water signal, less than 1/1000 of signal amplitude of the RF pulse in one of the two bands to suppress the fat or on-resonant water signal; or having an amplitude that is in the range of from about 100 to 10,000 times smaller than the amplitude of the RF pulse in one of the two bands to suppress the fat or on-resonant water signal. If imaging was performed directly after this single spectrally selective presaturation radiofrequency pulse, the first and second region could be characterized as having an output signal amplitude that is one of about zero, greater than 100 times smaller than the signal amplitude of the signal from both the 3rd and 4th regions.

Referring now also to FIGS. 4A-D, these figures are illustrations of various frequency spectrums demonstrating how the invention suppresses the fat and on-resonant water signal from the perspective of the frequency spectrum. One figure, FIG. 4A, is illustrative of a frequency spectrum in the presence of fat, water protons, and a non-diamagnetic susceptibility inducing substance. For the purpose of this diagram, the on-resonance water signal is centered at 0 Hz, and the fat signal is centered at −214 Hz (the approximate fat resonance frequency shift at 1.5 T). Also, spectra, symmetric about the central water proton frequency, are shown to demonstrate how off-resonant protons affected by magnetic susceptibility gradients might appear.

Figure 4B:
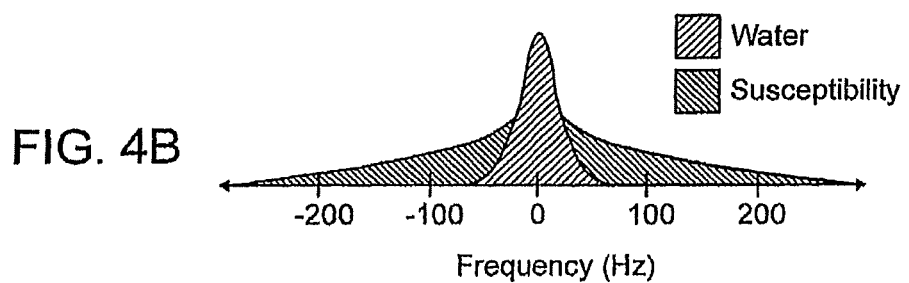

As described herein, the first interval 10 of the pulse sequence uses a pair of 180° RF pulses 12a,b or a spectrally selective RF pulse in combination with crusher gradients to suppress the fat signal. There is shown in FIG. 4B, another frequency spectrum in which the fat signal shown in FIG. 4A is suppressed leaving a frequency spectrum for water protons, and a non-diamagnetic susceptibility inducing substance.

Figure 4C:
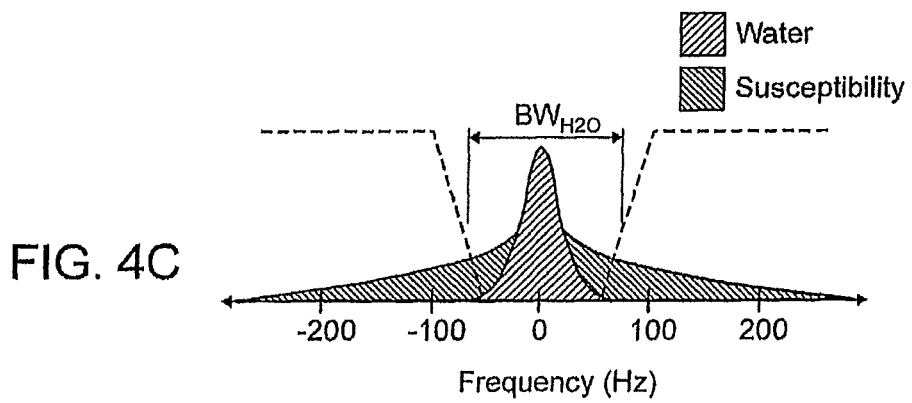
Figure 4D:
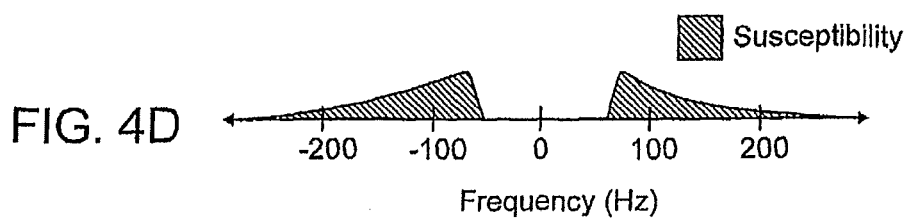

As described herein, during the second interval 20 of the pulse sequences, a spectrally-selective RF pulse with a center frequency matching the resonance frequency of water and a bandwidth $BW_{H2O}$ acts to suppress the on-resonant water frequencies, where an illustrative bandwidth $BW_{H2O}$ of the spectrally selective pulse is shown in FIG. 4C. There is shown in FIG. 4D another illustration of a frequency spectrum but in which the on-resonant water signal is suppressed, which leaves only signal from the magnetic susceptibility gradients. Thus, the resulting signal is then attributed to off-resonance frequencies due to magnetic susceptibility gradients. As can be seen from these figures, a high signal is obtained from off-resonant protons.

Also, the frequency shift associated with the MSGs can be theoretically approximated. The local external field shift $\Delta B_z$ of a non-diamagnetic spherical object exposed to a static magnetic field ($B_0$) has previously been described as [Yablonskiy, D. A. and E. M. Haacke. Theory of NMR signal behavior in magnetically inhomogeneous tissues: the static dephasing regime. Magn Resort Med 1994; 32 (6): 749-763]:

$$\Delta B_z(r, \theta)_{ext} = \frac{\Delta \chi}{3} \frac{a^3}{r^3}(3\cos^2\theta - 1)B_0 \qquad [\text{Eq. 4}]$$

where r is the radial distance from the center of the particle, θ is the angle between a radial vector and the static magnetic field vector $B_0$, γ is the gyromagnetic ratio for protons, $\Delta\chi$ is the susceptibility difference between the object and its surroundings, and a is the particle radius. Therefore, if the given magnetic susceptibility values for the tissues, the particle size, and the magnetic field strength are known, the associated frequency shift can be determined as:

$$\Delta\omega(r,\theta) = \gamma \Delta B_z(r,\theta) \qquad [\text{Eq. 5}]$$

Equations 4 and 5 also provide the framework for understanding the source of the off-resonant frequencies and subsequent positive signal enhancement.

After suppression of the fat and/or on-resonant water signal (Steps 110, 112, 114), the process proceeds with the acquisition of the image data, Step 120. Such data acquisition can be used for developing one, two or three dimensional images of the region or area of interest. Such images can be used for any of a number of purposes, including but not limited to quantifying constituents with the region or area of interests and/or providing a visual image of the region or area of interest. Following suppression of the fat and/or on-resonant water signals, the present invention contemplates, and thus it is within the scope of the present invention, to acquire such MRI image data using any of a number of MRI image acquisition techniques known to those skilled in the art including those using spin echo and gradient echo imaging sequences.

Following image acquisition, a determination is made as to whether imaging is complete or a given image acquisition is complete, Step 130. If the image acquisition process is completed or when another volume, region or area of interest is to be imaged (Yes, Step 130), then the given process is ended, Step 140. Thereafter, if further MRI imaging is required, the process is restarted, Step 100. If the image acquisition process is to be repeated at another time or after performing another suppression of fat and/or on-resonant water signals (No, Step 130), then the process returns to step 110.

While the present invention contemplates suppressing fat/water signals before imaging an entire volume, region or area of interest, the present invention is not so limited. In a exemplary embodiment, the suppression of one or both of fat signals and on-resonant water signals is slice or no-slice selective. If non-slice selective, non-slice selective slice pulses are applied which allows the clinician to acquire image data for a plurality, more specifically multiple slices before suppression is performed again. If the process is slice selective, then suppression would undertake for each slice being acquired. Also, if another region, volume or area of interest is to be imaged such as when re-positioning the object/patient, then the signal suppression process would be performed again for the new region, volume or area of interest and whether slice or non-slice selective.

In addition, it can be desirable to control the different suppression techniques based on composition of the region of interest. For example, if a part of the region of interest includes fat whereas other part of the region does not or the fat content is insignificant, then the clinician can alter the suppression schemes so that fat and on-resonant water signals are suppressed in the part including the fat and so that on-resonant water signals are suppressed in other part.

As indicated herein, the present invention also includes MRI systems and MRI apparatus that embody the MRI imaging methodology described herein. Referring now to FIG. 5 there is shown a schematic view of an exemplary MRI system 500 having a RF excitation and MR signal detection apparatus.

The illustrated MRI system 500 includes an electromagnet or main magnet 504, a computer 506, a main magnetic field control 508, a gradient coil sub-system 510, gradient magnetic field power amplifiers 512, an imager 514, a display device 516, a RF excitation and MR signal detection apparatus 520, an RF transmit coil(s) 526 and a detection coil(s) 525.

The electromagnet 502 produces a strong main magnetic field Bo in which a body or object to be imaged, a patient, is placed on a suitable support or table (not shown). The strength of the magnetic field of the main magnet 504, and hence in the body or object, is controlled by the computer 506 via a main magnetic field control 508, which controls the supply of energizing current to the electromagnet energizing coil. Alternatively, for superconducting MRI electromagnets, with inherently highly-stable fields, the field is charged and set to an exact value upon installation, and not altered during normal operation.

The gradient coil sub-system 510, comprising one or more gradient coils, whereby a magnetic field gradient can be imposed on the static magnetic field in the sample volume in any one or more of three orthogonal directions X, Y, and Z. The gradient coil sub-system 510 is energized by a gradient field power amplifiers 512 that are under the control of the computer. The gradient coils 510 also are controlled so as to carry out the fat and on-resonant water signal suppression techniques as described herein.

The RF excitation and MR signal detection apparatus 520 according to the present invention includes an RF transmitter 522 and MR signal detection circuitry 524, where the RF transmitted is coupled to the transmitter coils 526 and the MR signal detection circuitry is selectively coupled to the detection coil(s) 525. The RF transmitter 522 is under the control of the computer 506 so that RF field pulses or signals are selectively generated and applied to the body transmit coil for excitation of magnetic resonance in the body as well as for use in suppression of the fat and/or on-resonant water signals as herein described. While these RF excitation pulses are being applied to the body, switches in the MR signal detection circuitry 524 are actuated so as to de-couple the detection coil(s) 525 from the MR signal detection circuitry. In this way, the RF signals being transmitted are not detected by the MR signal detection circuitry.

Following application of the RF excitation pulses, the switches are again actuated to couple the detection coil(s) 525 to the MR signal detection circuitry 524. The detection coil(s) detect or sense the MR signals resulting from the excited nuclei in the body and conducts the MR signals onto the MR signal detection circuitry 524. These detected MR signals are in turn passed onto the imager 514. The imager 514, under the control of the computer 506, processes the signals to produce signals representing an image of a region of interest in the body 2. These processed signals can be sent onto a display device 516 to provide a visual display of the image.

As is known to those skilled in the art, a plurality of detection coils can be deployed for detecting MR signals from the object/patient. It such cases, each of the plurality of coils can be arranged so to form a separate channel. As also indicated herein, and it is contemplated that the such a plurality of detection coils 525 and the MR signal and detection circuitry 524 can be arranged so that the coils are de-coupled from each other as also described herein.

In operation, the uniform magnetic field $B_0$ generated by the main magnet 504 is applied to the object/body by convention along the Z-axis of a Cartesian coordinate system, the origin of which is at the center of the magnet and typically near or within the region of interest being imaged in the object. The uniform magnetic field $B_o$ being applied has the effect of aligning the nuclear magnetization of the nuclei in the object/body, along the Z-axis. Following suppression of signals, and in response to RF pulses of the proper frequency being generated by the RF transmitter 522, that are orientated within the XY plane, the nuclei resonate at their Larmor frequencies, producing a time-dependent XY magnetization at the NMR frequency which can be detected by the detection coil(s) 524. In one typical imaging sequence, the RF signal centered about the desired Larmor frequency is applied to the object/body at the same time a magnetic field gradient $G_z$ is being applied along the Z-axis by means of the gradient control sub-system 510. This gradient field $G_z$ causes only the nuclei in a slice with a limited width through the object/body along the XY plane, to have the resonant frequency and to be excited into resonance, a process typically referred to as selective excitation.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the precessing nuclei by frequency (i.e., frequency encoding). The Y-axis gradient $G_y$ is incremented through a series of values and encodes the Y position into the rate of change of the phase of the precessing nuclei as a function of gradient amplitude, a process typically referred to as phase encoding. Phase-encoding can be extended to more than one dimensions for example, by replacing selective excitation of the single slice using a $G_z$ gradient pulse applied during excitation as described above, with Z-gradient incrementation after the excitation. By such means full three-dimensional (3D) volume imaging is achieved, for example, by phase-encoding in two dimensions (Z, Y) and applying frequency encoding in the third dimension (X).

Figure 6:
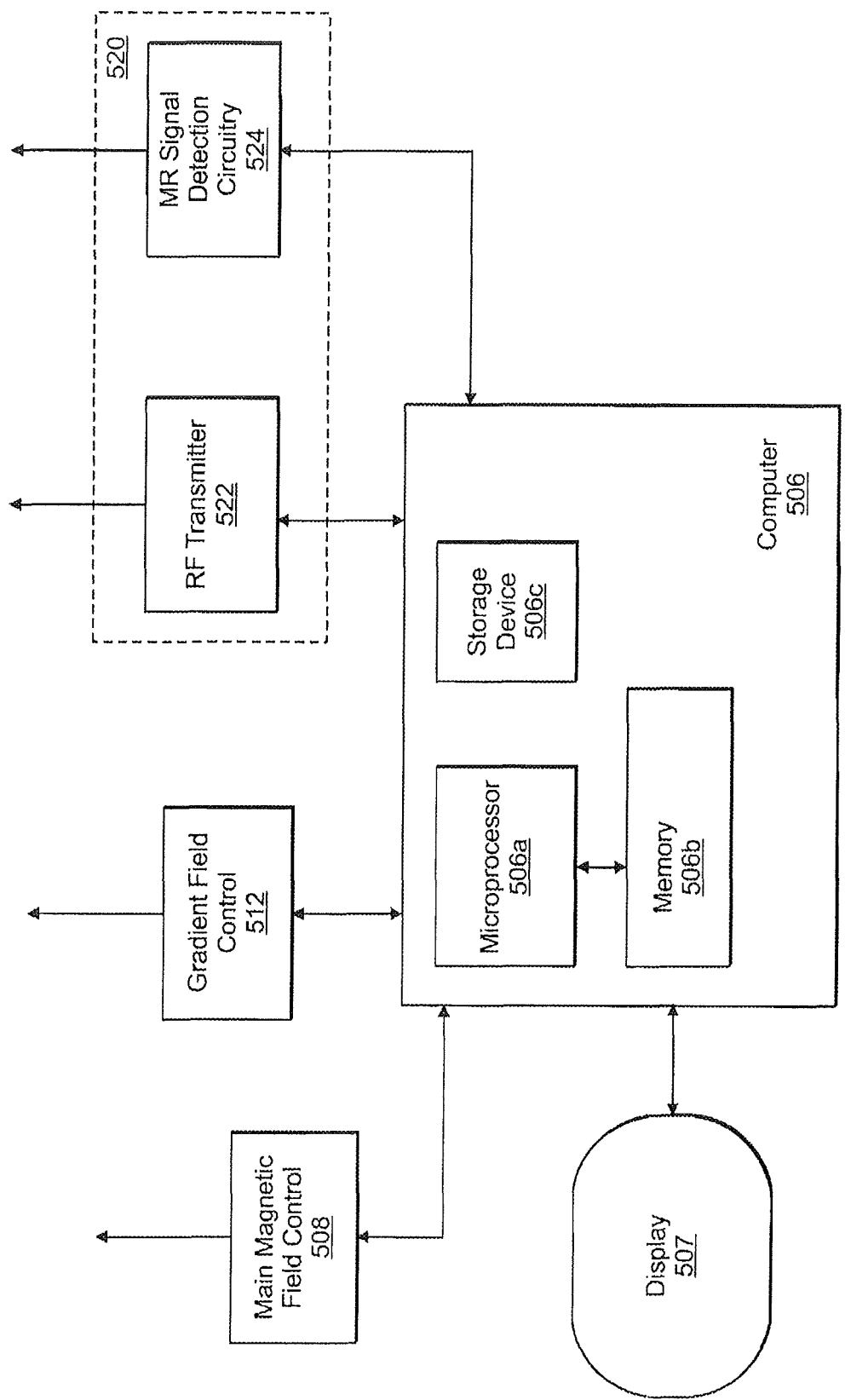
FIG. 6 is a schematic view of a computer system including an applications program embodying the methodology of the present invention for controlling the acquisition of MRI data.

Referring now to FIG. 6 there is shown a schematic view of a computer 506 for controlling the acquisition of the image data on which computer system an applications program embodying the methodology described herein is executed. Such a computer 506 includes a microprocessor 506a, a memory 506b (e.g., RAM, NVRAM), and a storage device 506c on which programs such as the applications program embodying the methodology of the present invention and other information can be stored. The computer 506 receives inputs from and provides control outputs to each of the main magnetic field control 508, the gradient coil sub-system 510, the RF transmitter 522 and the MR signal detection circuitry 524 as described herein.

Such an applications program for execution on the computer 506 includes code segments, instructions and criteria for carrying out the methodology described herein. The computer 506 also processes the MRI image data as herein described and provides outputs 230 to the imager 514. In addition, the computer 506 can be operably coupled to a display 507 that can be dedicated to the process of controlling operation of data acquisition including control of the parameters for suppression of the fat and/or on-resonant water signals.

As indicated herein, the methodologies of the present invention as well there embodiment in MRI imaging system and apparatuses can be used in many applications. The following examples are illustrative of the use of such methods in various applications in which the present invention produces positive contrast for objects that produce magnetic susceptibility gradients. The invention should not be interpreted as being limited to the following examples, but rather should be taken to encompass any variation that may become apparent based on presentation of the invention.

Example 1

This example concerns imaging of vascular devices. A saline phantom containing a drug-eluting stainless steel stent (SS), an undeployed MR-compatible nitinol stents (Nitinol), and an MR-compatible imaging guidewire (MRIG) were imaged on a 1.5 T scanner using the IRON sequence. Two-dimensional (2D) slices and 3-dimensional (3D) volumes were acquired with and without the double inversion recovery fat suppression RF pulses. Images using the suppression based imaging methods of the present invention were acquired using fast spin echo (FSE) imaging and the imaging parameters were 180 mm field of view (FOV), 2000 ins repetition time (TR), 7 ms echo time (TE), 0.7×0.7 mm in-plane resolution (RES), 2 signal averages (NSA), and 24 echo train length (ETL). There are shown in FIG. 7A-C various cross-sectional images of the devices placed on a bottle containing copper sulfate.

Figure 7A:
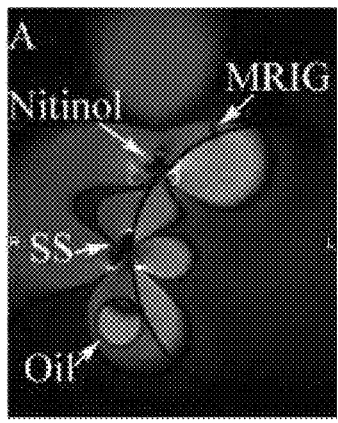
FIGS. 7A-C are cross-sectional images of various interventional vascular devices acquired without fat suppression (FIG. 7A) and with fat suppression (FIGS. 7B,C). The devices include an undeployed stainless steel (SS) stent, an MR-compatible nitinol stent, and an MR-compatible imaging guidewire (MRIG). A syringe filled with baby oil (Oil) was used to demonstrate fat suppression. These images also illustrate how signal enhancement of the devices differs when the bandwidth of the spectrally-selective RF pulse is 340 Hz (A), 160 Hz (B), and 100 Hz (FIG. 7C).
Figure 7B:
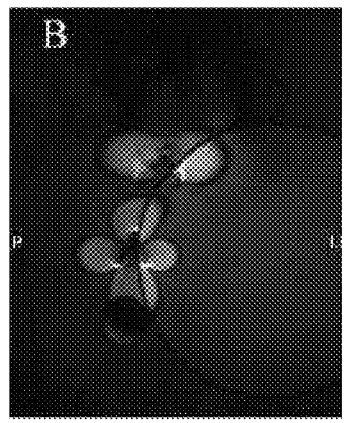
Figure 7C:
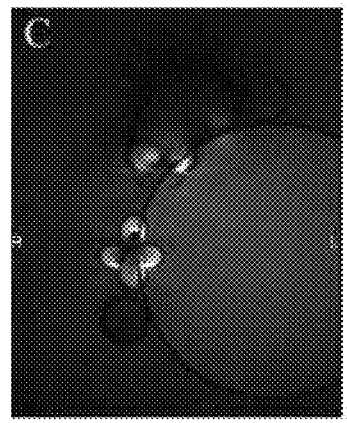

In FIG. 7A, the image was acquired without fat suppression and the bandwidth of the spectrally-selective RF pulse was 340 Hz. The nitinol stent and the SS stent were clearly visualized, while the MRIG (when not connected to the scanner) did not create a hyperintense signal. Furthermore, the lack of fat suppression is evident by the hyperintense signal from a 10 cc syringe of baby oil. As shown in FIG. 7B, when fat suppression was applied, the signal from the syringe filled with baby oil disappeared. Also in FIG. 7B, the bandwidth was reduced to 160 Hz and the extent of signal enhancement was refined. Further refinement of the signal enhancement from the stents was seen using a bandwidth of 100 Hz. It is therefore evident that the methods of the present invention used for suppression can adequately visualize vascular devices and that the size of the signal enhancement can be altered by changing the bandwidth of the spectrally-selective RF pulse.

Figure 8A:
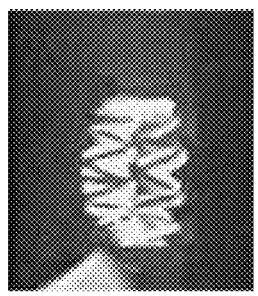
FIGS. 8A-C are various illustrations of an expanded MR-compatible nitinol stent imaged in water using the suppression methods of the present invention. Three selected maximum intensity projections from a 3D imaging volume are displayed. The struts of the stent are clearly visualized in A & B. The stent was expanded in a plexi-glass tube (black ring in C).
Figure 8B:
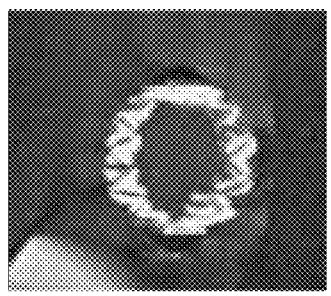
Figure 8C:
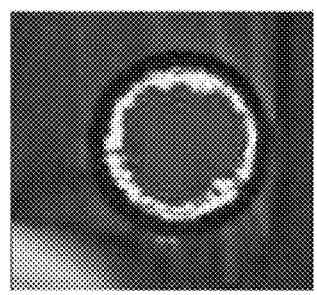

In addition, high resolution images (0.7×0.7×0.7 mm$^3$ RES) of an expanded MR-compatible nitinol stent were acquired using the methods of the present invention and FSE image acquisition. The struts of the expanded stent were clearly visualized when a three-dimensional volume was acquired. Three selected maximum intensity projections from a 3D imaging volume are displayed in FIGS. 8A-C. The struts of the stent are clearly visualized in FIGS. 8A, B and the stent was expanded in a plexi-glass tube (black ring in FIG. 8C).

Example 2

Figure 9A:
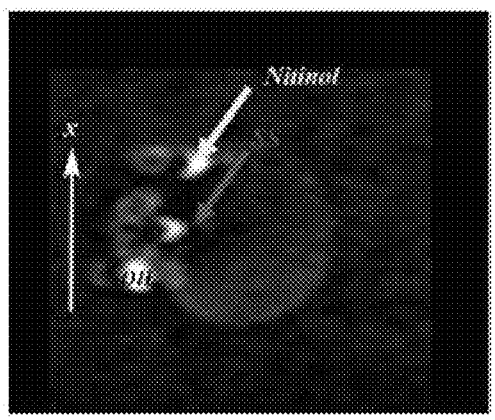
FIG. 9A is a single gradient and spin echo (GRASE) image of the phantom from FIG. 7 which is moved back and forth in the x direction. The trajectory in x direction of the stainless steel stent (see arrow) over time (t) is shown in FIG. 9B.
Figure 9B:
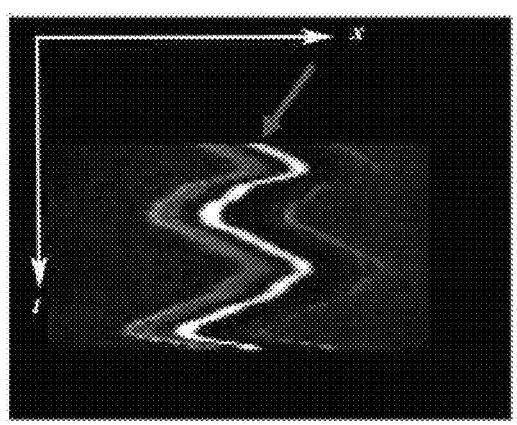

This example concerned imaging of vascular devices in real time. In this example, the suppression methods of the present invention were used in conjunction with a Gradient and Spin Echo (GRASE) image acquisition technique [Oshio, K. and D. A. Feinberg. GRASE (gradient- and spin-echo) imaging: a novel fast MRI technique. *Magn Reson Med* 1991; 20 (2): 344-349]. The saline phantom and devices were imaged using an interactive GRASE sequence (180 mm FOV, 158 ms acquisition time (TA); 5.8 ms TE; 4×4×5 mm$^3$; and turbo factor of 11) while the phantom was moved in the magnet. A single cross-sectional image of the phantom is shown in FIG. 9A with low resolution images of the nitinol and stainless steel stents. The trajectory in the x direction of the stainless steel stent (red arrows) over time (t) is shown in FIG. 9B.

Example 3

This example concerns imaging of endovascular devices in vivo.

Figure 10B:
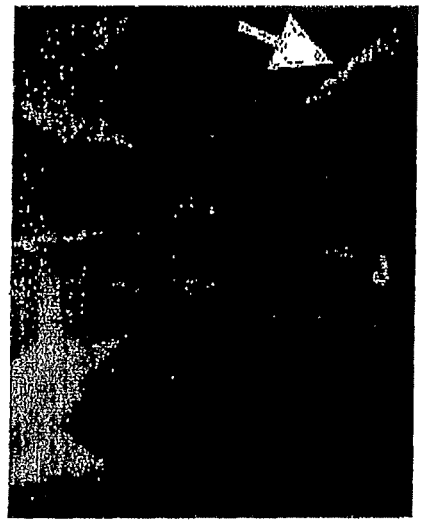
FIGS. 10A-D are illustrations showing deployment of platinum coils in the left superficial femoral artery of a rabbit. The deployed platinum coils appear hypointense in the femoral artery in high resolution gradient echo images (FIG. 10A) and signal enhanced in high resolution images using methods of the present invention (FIG. 10B) Enlargements of the coil region for FIGS. 10A,B are shown respectively in FIGS. 10C, D, where the underlying structure of the coils is visible in FIG. 10D.
Figure 10D:
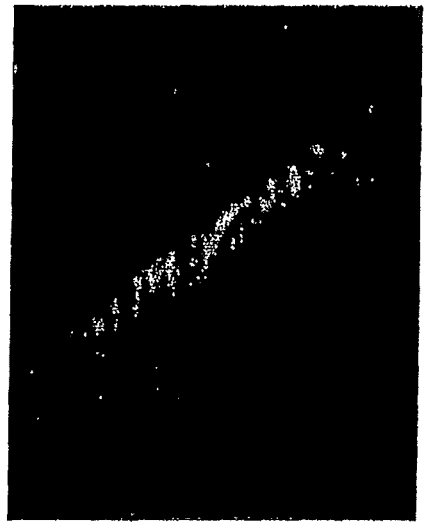
Figure 10A:
Figure 10C:
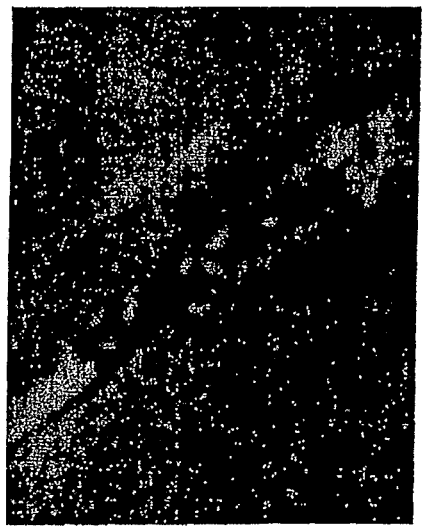

A rabbit model of hind limb ischemia was employed, whereby platinum coils were placed percutaneously into the left femoral artery under X-ray-fluoroscopy. Two- and Three-dimensional MR images according to the methodology of the present invention were acquired using FSE imaging and the imaging parameters were 180 mm FOV, 2000 ms TR, 8.6 ms TE, 0.35×0.35×1.5 mm$^3$ RES, 4 NSA, and 24 ETL. The excitation radio frequency (RF) pulse for fat suppression had a flip angle ($\alpha_{fat}$) of 95 degrees and duration ($\tau_{fat}$) of 15 ms, and the excitation RF pulse for water suppression had a flip angle ($\alpha_{wafer}$) of 90 degrees and duration ($\tau_{water}$) of 35 ms. GRE imaging of the same slices was performed with 270 mm FOV, 13.6 ms TR, 3.7 ms TE, 20 degree FA, 0.35×0.35×1.5 mm$^3$ RES, 2 NSA, and 12 ETL. GRE and MRI images according to the present invention of the platinum coils in the left femoral artery of a rabbit are shown in FIGS. 10A,B. In the GRE image (FIG. 10A), the platinum coils appear as signal voids, whereas the coils appear hyperintense in the MR image (FIG. 10B) using the methods of the present invention. Enlargements of these images are shown in FIGS. 10C,D respectively, allowing clearer visualization of the platinum coils.

Also, a carotid artery cut-down was performed in a dog and an MR-compatible guidewire and a balloon catheter equipped with a stainless steel stent (3 Fr×15 mm) were advanced down to the left iliac artery. Prior to catheter introduction, a time-of-flight MR angiogram (TOF-MRA) was acquired to provide a roadmap for imaging. A real-time GRASE sequence using the methods of the present invention was used to track the movement of the catheter with the following imaging parameters: 460 mm FOV, 763 ms TR, 7.0 ms TE, 3.6×3.6×5.0 mm$^3$ RES, 90 degree FA, and 16 ETL.

Figure 11A:
FIGS. 11A-C illustrate that the signal enhancement from a balloon-expandable stainless steel stent can be used to track the movement (indicated by dashed line) of the catheter through the iliac artery of a canine. Once the stent was in the desired location (FIG. 11C), the balloon was inflated to deploy the stent and signal enhancement around the stent increased (FIG. 11D). An ellipse is used to highlight the stent location and give a relative size of enhancement between the undeployed and deployed stent. Time-of-flight MR angiogram (TOF-MRA) was used as a roadmap for guidance and assessment of stent placement. A maximum intensity projection of a TOF-MRA acquired post stent deployment illustrates the typical signal void created by a stainless steel stent (FIG. 11E). High resolution imaging using the methods of the present invention and using a fast spin echo acquisition showed signal enhancement around the deployed stent is shown in FIG. 11F. In this example, the method of the present invention was combined with a real-time gradient and spin echo (GRASE) acquisition scheme that allowed tracking of the catheter and stent at a rate greater than frames/sec.
Figure 11B:
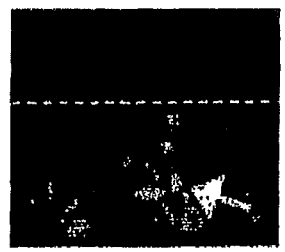
Figure 11C:
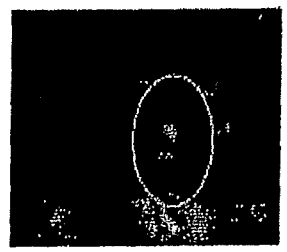
Figure 11D:
Figure 11E:
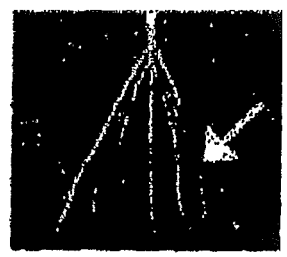
Figure 11F:

The excitation radio frequency pulse for fat suppression and water suppression has the following characteristics/parameters; 95 degrees $\alpha_{fat}$, 15 ms $\tau_{fat}$, 105 degrees $\alpha_{water}$ and 35 ms $\tau_{water}$. FIGS. 11A-D are illustrations showing the stent and catheter being advanced and deployed in the iliac artery. Signal enhancement increased as the stent was deployed (FIG. 11D). A TOF-MRA acquired after stent deployment (FIG. 11E) shows signal loss in the area corresponding to the stent; this is a characteristic of TOF-MRA imaging and confirms stent placement. High resolution imaging using the methods of the present invention was further performed using a GRE acquisition (350 mm FOV, 10.2 ms TR, 5.0 ms TE, 20 degree FA, 0.68×0.68×5.0 mm³ RES, 24 ETL and the RF pulse characteristics/parameters for the present invention were equivalent to previous values) and showed good signal enhancement and spatial agreement. The foregoing also shows that the methods of the present invention can be combined with real-time imaging for use in catheter tracking for guidance of stent placement and deployment.

Example 4

This example investigates the efficacy of methods of the present invention for imaging cells labeled with superparamagnetic iron oxide (SPIO) nanoparticles.

A 15 mL sample tube was filled with agarose, and mesenchymal stem cells (MSCs) labeled with ferumoxides-poly-L-lysine were injected as a vein into the gel. The ferumoxides-poly-L-lysine labeling method has been previously described [Frank, J. A., Miller, B. R., Arbab, A. S., Zywicke, H. A., Jordan, E. K., Lewis, B. K., Bryant et al., L. H., Jr. and J. W. Butte, Clinically applicable labeling of mammalian and stem cells by combining superparamagnetic iron oxides and transfection agents. Radiology 2003; 228 (2): 480-487]. The sample tube was placed in a larger acrylamide phantom for effective coil loading. FSE images (180 mm FOV; 0.7×0.7×5 mm RES; 4.6 ms TE; 2000 ms TR; 4.6 ms inter-echo spacing; 24 ETL; 2 NSA) were acquired without (FIG. 12A) and with (FIG. 12B) the pre-pulses for signal suppression.

Figure 12A:
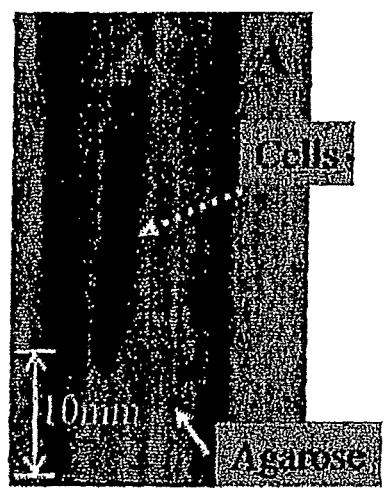
FIGS. 12A-E are illustrations of MRI imaging using the methods of the present invention of a vein of exogenously labeled ferumoxides-poly-L-lysine stem cells (dashed arrows) embedded in agarose. The in vitro MRI imaging of a vein of exogenously labeled ferumoxides-poly-L-lysine stem cells (dashed arrows) embedded in agarose was performed without (FIG. 12A) and with (FIG. 12B) on-resonant water suppression. Imaging perpendicular to the vein (FIGS. 12C-E) with incremental $BW_{H2O}$ (100 Hz, 170 Hz, and 340 Hz, respectively) of the spectrally-selective saturation pulse leads to a change in size of the dipolar signal-enhanced area surrounding the cells. The polar angle $\theta_0$ between maximum and minimum signal intensity measured 54°.
Figure 12B:
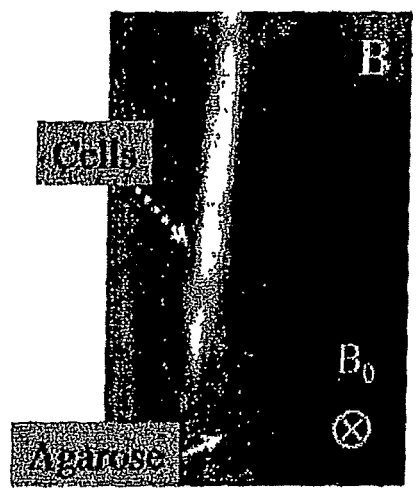
Figure 12C:
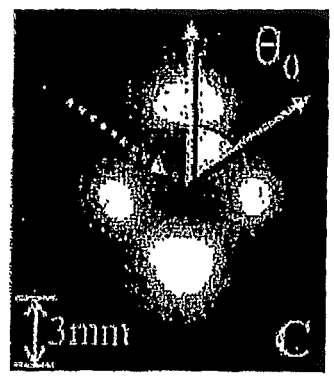
Figure 12D:
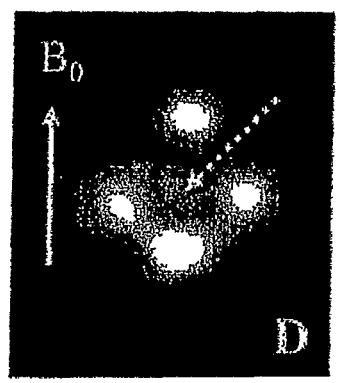
Figure 12E:
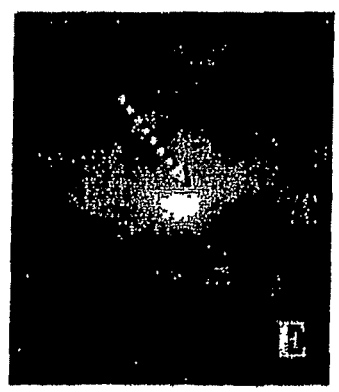

While a signal void is obvious at the injection site of the cells in FIG. 12A (Contrast-to-Noise Ratio (CNR)~14), the MR image from using the methods of the present invention in FIG. 12B clearly shows substantial signal enhancement in the same area with heavily attenuated agarose signal (CNR~47). The axial images (FIG. 12C-E) of the same phantom reveal the characteristic dipolar field of signal enhancement surrounding the cells, as described by Eq. [4]. The images demonstrate the ability to refine the degree of signal hyperenhancement by adjusting the bandwidth of the spectrally-selective water saturation pulse (100 Hz for FIG. 12C, 170 Hz for FIG. 12D, and 340 Hz for FIG. 12C). CNR were 40, 24, and 7, and the areas of signal enhancement were 24 mm², 16 mm², and 6 mm², respectively. Furthermore, the angle $\theta_0$ between the main static magnetic field $B_0$ and the vector r extending along the zero crossing of signal enhancement was 54° (FIG. 12C) which is consistent to the predicted angle 54.7° from Eq. [4].

Another experiment was performed to test the sensitivity of the invention for detecting different quantities of ferumoxide-labeled cells in vitro. An agarose phantom was created using a 24-well culture plate. Wells were filled with agarose except for a 100 μL space. Cell dilutions of 2.0, 1.5, 0.75, 0.5, 0.2, and 0.1 million ferumoxides-poly-L-lysine labeled MSCs were made, combined with low temperature agarose, and injected into the remaining 100 μL space. Cellular iron content, based on previous measurements, was estimated to be ~10 pg/cell. Three-dimensional GRE images (FIG. 13A) and FSE images without (FIG. 13B) and with (FIG. 13C) suppression based pre-pulses according to the present invention were acquired using the following imaging parameters: 180 mm FOV, 2000 ms. TR, 4.8 ms TE, 0.7×0.7×2 mm³ RES, 2 NSA, 4.6 ms inter-echo spacing and 24 ETL for FSE and MRI images according to the present invention, and 30° flip angle for gradient echo images.

Figure 13A:
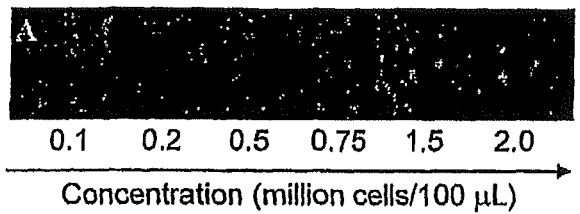
FIGS. 13A-C are illustrations of MR images in particular transaxial GRE images (FIG. 13A), FSE images (FIG. 13B) and images acquired using the method of the present invention (FIG. 13C) of well plates containing 0.1, 0.2, 0.5, 0.75, 1.5, and 2.0 million ferumoxides-poly-L-lysine labeled mesenchymal stem cells (increasing concentrations from left to right). Signal voids are observed in FIGS. 13A and 13B with significant distortions in FIG. 13A. The MRI images acquired using the methods of the present invention show positive contrast enhancement that increases with increased concentration.
Figure 13B:
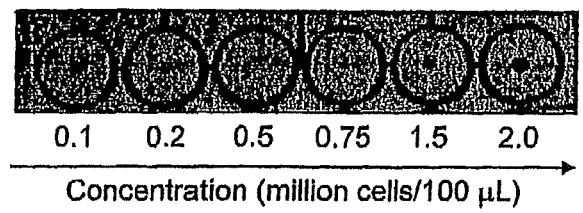
Figure 13C:
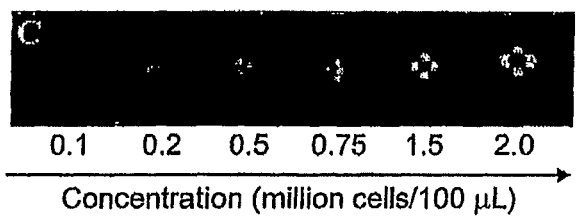
Figure 14:
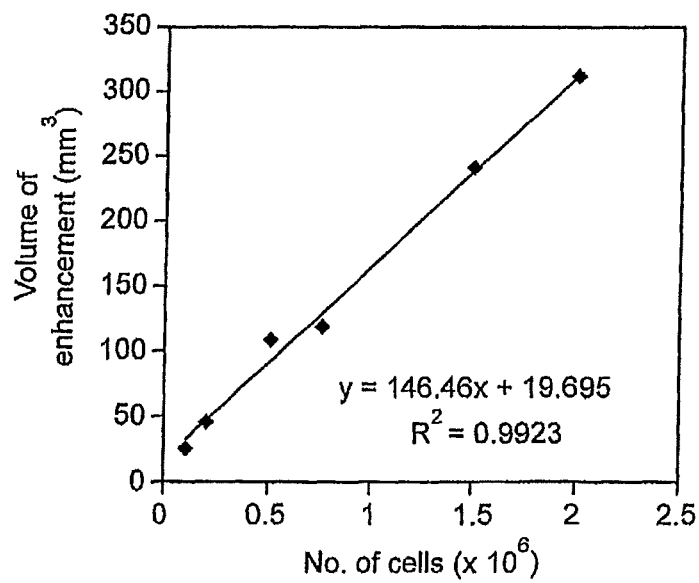
FIG. 14 is a plot of the linear regression of volume of signal enhancement from imaging using methods of the present invention to the number of ferumoxides-poly-L-lysine labeled cells in the culture well. The black line shows a linear fit for the data and demonstrates the high correlation between signal enhancement area and the number of labeled cells ($R^2$=0.99).

In FIGS. 13A,B signal voids are evident, while signal enhancement is observed in the MRI images using the methods of the present invention (FIG. 13C) of the agarose phantom containing different cell concentrations. Average CNR was 29±3 for GRE images, 29±20 for FSE images, and 53±20 for the MRI images acquired using the methods of the present invention. The volume of signal enhancement in images acquired using the methods of the present invention was found to be directly related to the concentration of the iron oxide labeled cells (FIG. 14, $R^2$=0.99). This shows the potential to quantify labeled cell concentrations noninvasively using the positive contrast imaging method of the present invention.

Example 5

The following were used to evaluate the in vivo imaging of cells labeled with superparamagnetic iron oxide (SPIO) nanoparticles.

Figure 15A:
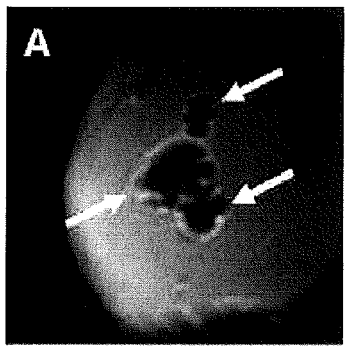
FIGS. 15 A-C are illustration of various MRI images an ischemic rabbit hind limb following injection of ferumoxides-poly-L-lysine labeled MSCs, in particular GRE images (FIG. 15A), FSE images (FIG. 15B), and images acquired using the methods of the present invention (FIG. 15C) of the ischemic rabbit hind limb following injection of ferumoxides-poly-L-lysine labeled MSCs. The arrows indicate sites of injection.
Figure 15B:
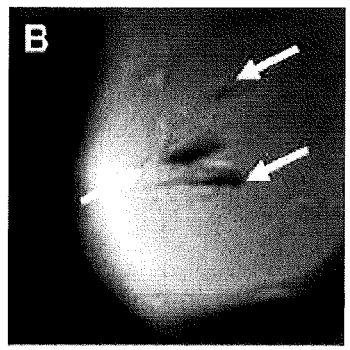
Figure 15C:
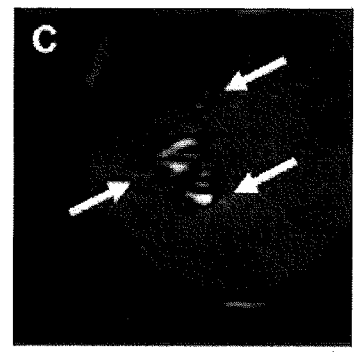

SPIO-labeled MSC were injected intramuscularly into the ischemic hind limb of a rabbit. A total of five injections were made with quantities ranging from 0.5-1 million labeled cells per injection. Two-dimensional GRE, FSE, and images using the methods of the present invention were acquired and are shown in FIGS. 15A-C with three injection sites visible in a double oblique slice. Imaging parameters were the same as used in Example 1 with a 340 Hz $BW_{H20}$. The GRE image (FIG. 15A) image shows large signal voids (see arrows) extending beyond the extent of the cells. The FSE image (FIG. 15B shows the labeled cells as signal voids, while dipolar signal enhancement is apparent in the image acquired using the methods of the present invention (FIG. 15C). The signal enhancement enables clear visualization of the cells and should not be confused with other areas which may exhibit signal voids.

Figure 16A:
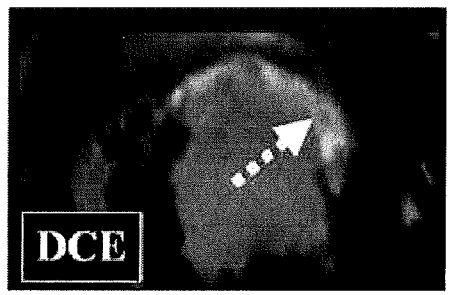
FIGS. 16 A-F are illustrations of various MRI images where, in a canine model of myocardial infarction, ferumoxides poly-L-lysine labeled mesenchymal stem cells (MSCs) were injected into infarcted myocardium as defined by delayed contrast-enhancement (FIG. 16A). Each injection site consisted of ~7×10⁶ labeled MSCs. The in vivo FSE image, images acquired using methods of the present invention and GRE images were acquired using ECG and respiratory gating (FIGS. 16B-D). The labeled MSCs were difficult to identify in FSE images. The imaging using methods of the present invention achieved good suppression of the myocardial signal and susceptibility enhancement providing clear visualization of the cells in the anterior heart wall (arrow, FIG. 16C). The enhancement corresponded well with the signal void in the corresponding GRE image (arrow, FIG. 16D). Ex vivo images according to the present invention and GRE imaging confirmed the in vivo findings (FIGS. 16E, F). DCE, delayed contrast-enhanced.
Figure 16B:
Figure 16C:
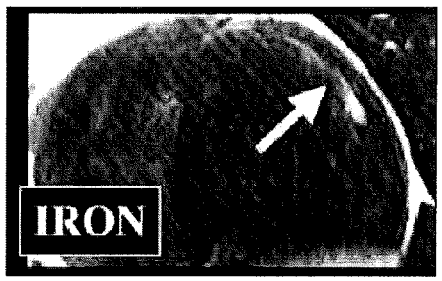
Figure 16D:
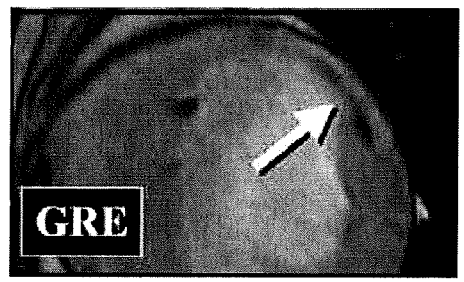
Figure 16E:
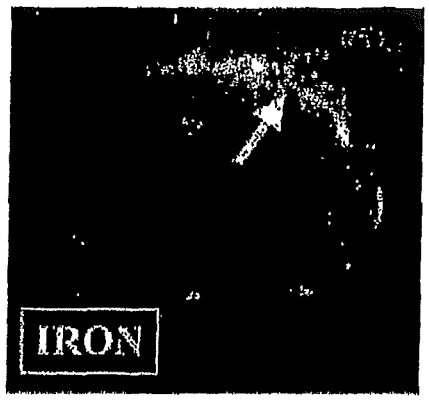
Figure 16F:
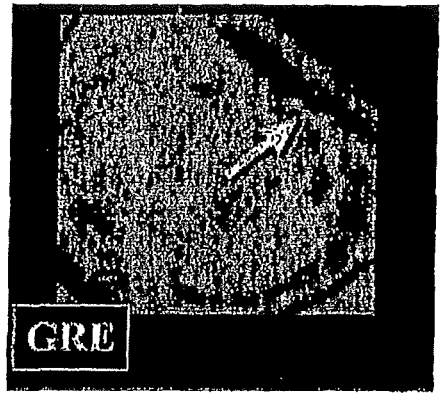

SPIO-labeled MSCs also were injected transmyocardially under MR fluoroscopy into the left ventricle of a canine with a myocardial infarction. FSE imaging using the methods of the present invention was combined with ECG and respiratory gating to image the labeled cells in the beating heart. Parameters for FSE and imaging according to the present invention included: 280 mm FOV, 1200 ms TR, 8.4 ms TE, 0.55×0.55×2.0 mm³ RES, 18 ETL. The water suppression parameters included: 95 degrees $\alpha_{water}$ and 50 ms $\tau_{water}$. The images for this example are shown in FIGS. 16A-F. The delayed contrast-enhanced image in FIG. 16A identifies the area of infarcted tissue. The ECG and respiratory-gated FSE image in FIG. 16B was unable to detect any SPIO-loaded cells. In contrast, the ECG and respiratory-gated images of the present invention in FIG. 16C shows hyperintense signal enhancement in the anterior wall of left ventricle. Hypointense signal is seen in the GRE image (270 FOV, 10 ms TR, 2.9 ms TE, 25 degree FA, 0.55×0.55×3.0 mm³ RES) in FIG. 16D and corresponds with the signal enhancement in the image acquired using the methods of the present invention. Ex vivo images were also acquired using the methods of the present invention (FIG. 16E) and GRE sequences (FIG. 16F) and agreed well with the the in vivo results.

Figure 17A:
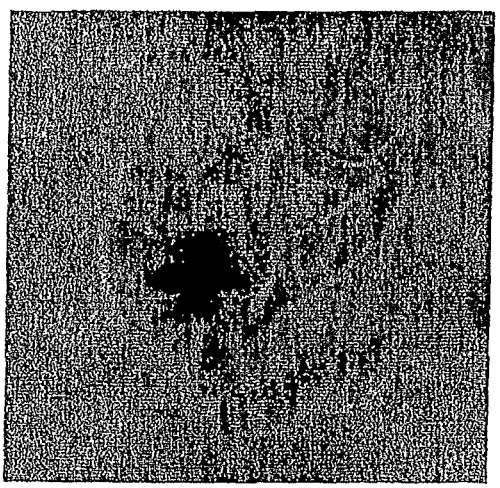
FIG. 17A is an ex vivo image of a swine pancreas containing a single ferumoxide-alginate capsule containing islet cells that appears as a hypointense area in fast gradient echo images (FGRE, left) and hyperintense signal in images using a FGRE pulse sequence and methods of the present invention (FIG. 17B). These images were a single image obtained using a 3D acquisition.
Figure 17B:
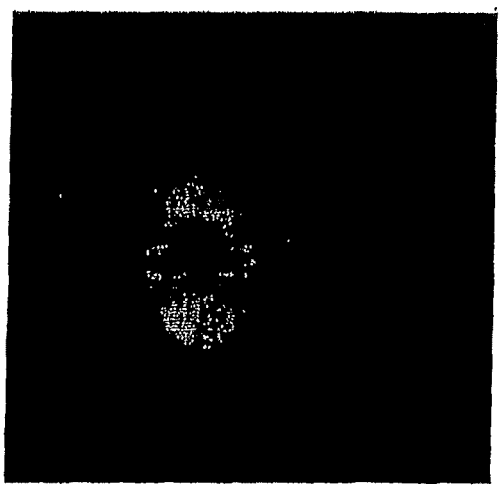

In addition, an alginate capsule containing ferumoxides poly-L-lysine and islet cells was injected into the pancreas of a pig. Following humane sacrifice, the pancreas was excised and imaged using FSE and the methods of the present invention (105 degrees $\alpha_{water}$ and 50 ms $\tau_{water}$) and conventional FSE imaging (180 mm FOV, 1300 ms TR, 12 ms TE, 0.36× 0.36×2.0 mm³ RES, 24 ETL). FIGS. 17A-B shows ex vivo images of a single labeled islet cell with a hypointense area in FSE image (FIG. 17A) and hyperintense signal in the images acquired using the methods of the present invention (FIG. 17B) and using a GRE image acquisition. These images were obtained using a 3D acquisition.

Example 6

This study investigated using the signal-enhancement method of the present invention for passive tracking and visualization of conventional and MR-compatible endovascular devices in vivo.

For this study, the method was performed using 2D and 3D FSE and a real-time 2D GRASE acquisition with a 1.5 T MR scanner (Intera, Philips Medical Systems).

A mongrel dog was anesthetized, and carotid arterial access was obtained. Prior to imaging using the signal-enhancement method of the present invention, a 3D MR angiography (SSFP time-of-flight; 6.4 ms TR, 3.2 ms/TE=6.4/3.2 ms, flip angle (FA)=75° degree FA, resolution=0.58×0.58× 3.0 mm³ RES) was performed to provide a roadmap for iliac artery catheterization. Under MR fluoroscopic imaging with the signal enhancement method, a conventional stainless steel stent (7 mm×15 mm, Genesis, Cordis Corp.) was advanced from the carotid artery into the right iliac artery using real-time GRASE with a suppression prepulse according to the methods of the present invention (190 Ins TR, 6 ms TE, FA=90 degree FA°, resolution=2.7×2.7×5.0 mm³ RES, ETL=16 ETL, IRON 95 degrees $\alpha_{water}$ and 30 ms $\tau_{water}$ angle=95°, angle bandwidth=170 Hz $BW_{H2O}$, and 300 ms inversion time). High resolution FSE images using the methods of the present invention were acquired after stent placement. Maximum intensity projections were created from the 3D MRA and registered with the 2D GRASE images acquired using the methods of the present invention.

Figure 18A:
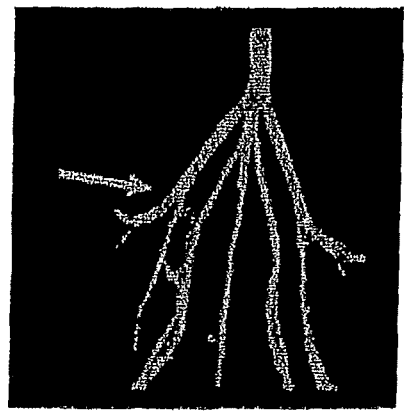
FIGS. 18A-B are illustrations of maximum intensity projections (MIPs) from a 3D MR angiography of the pelvic arteries before (FIG. 18A) and after (FIG. 18B) deployment of a stainless steel stent in the right iliac artery. As is typical with conventional stents, blood flow interrogation by 3D MRA is not possible after placement of a metallic stent (arrow in FIG. 18B).
Figure 18B:
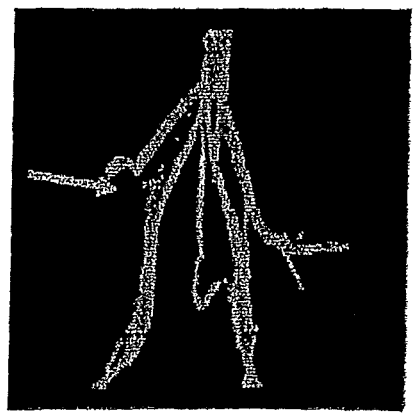

MIPs provided a roadmap image (FIGS. 18A,B) for successful MR-guided placement of a stainless steel stent in the left external iliac artery using the signal enhancement method of the present invention with a real-time GRASE acquisition. Guidance of the stent from a carotid approach into the descending aorta and deployment in the external iliac artery was clearly visualized (FIGS. 19A-C) on the real-time scans at a frame rate of 5 frames/second. Signal enhancement (arrows) along the vessel was used to guide the catheter and properly place the stent. Blood flow through the right external iliac artery was not visible by MRA following stent deployment as expected for the time-of-flight sequence (FIG. 18, right arrow). The high resolution cross-sectional 2D image in FIG. 20 shows positive signal enhancement of the conventional stainless steel stent.

Although a preferred embodiment of the invention has been described using specific terms, such description is for illustrative purposes only, and it is to be understood that changes and variations may be made without departing from the spirit or scope of the following claims.

INCORPORATION BY REFERENCE

All patents, published patent applications and other references disclosed herein are hereby expressly incorporated by reference in their entireties by reference.

EQUIVALENTS

Those skilled in the art will recognize, or be able to ascertain using no more than routine experimentation, many equivalents of the specific embodiments of the invention described herein. Such equivalents are intended to be encompassed by the following claims.

What is claimed is:

1. A method for magnetic resonance imaging of a volume, such a volume having therein one of magnetic susceptibility-generating objects or interfaces having susceptibility mismatches; said method comprising the step(s) of:
    selectively visualizing, using a magnetic resonance imaging process, the susceptibility-generating objects or interfaces having susceptibility mismatches as hyperintense signal in a volume; and
    wherein such visualizing includes attenuating or essentially suppressing a signal from one or more of fat and on-resonant water, so as to control a geometric extent of a signal enhancing effect with respect to the susceptibility-generating objects or interfaces having susceptibility mismatches.

2. The method of claim 1, wherein said attenuating or essentially suppressing of the signal from one or more of fat and on-resonant water includes:
    enhancing a signal(s) associated with magnetic susceptibility gradient(s).

3. A magnetic resonance imaging (MRI) system comprising:
    a gradient magnetic sub-system including one or more gradient magnets and a power controller for selectively operating each of the one or more gradient magnets;
    an RF transmitter sub-system, including an RF transmitter and one or more antennas operably coupled thereto;
    system controller for selectively controlling each of the gradient magnetic subsystem and the RF subsystem, said controller including a microprocessor; and
    an applications program for execution on the system controller, said applications program including code segments, instructions and criteria for:
        controlling each of the gradient magnetic sub-system and RF subsystem so as to selectively visualize the susceptibility-generating objects or interfaces having susceptibility mismatches as hyperintense signals, where such visualizing includes attenuating or essentially suppressing a signal from one or more of fat and on-resonant water, so as to control a geometric extent of a signal enhancing effect with respect to the susceptibility-generating objects or interfaces having susceptibility mismatches.

4. The MRI system of claim 3, wherein said attenuating or essentially suppressing of the signal from one or more of fat and on-resonant water includes code segments, instructions and criteria to enhance a signal(s) associated with magnetic susceptibility gradient(s).

* * * * *